(12) United States Patent
Takahashi

(10) Patent No.: US 6,579,780 B2
(45) Date of Patent: Jun. 17, 2003

(54) METHOD FOR GROWING A COMPOUND SEMICONDUCTOR, QUANTUM WELL STRUCTURE USING THE SAME, AND COMPOUND SEMICONDUCTOR DEVICE INCLUDING THE SAME

(75) Inventor: Koji Takahashi, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/746,930

(22) Filed: Dec. 26, 2000

(65) Prior Publication Data

US 2001/0006840 A1 Jul. 5, 2001

(30) Foreign Application Priority Data

Dec. 27, 1999 (JP) ............................................ 11-369298

(51) Int. Cl.$^7$ ............................................... H01L 21/20
(52) U.S. Cl. ......................... 438/479; 438/46; 438/483
(58) Field of Search ............................. 438/22, 24, 46, 438/41, 44, 479, 483, 492–509

(56) References Cited

U.S. PATENT DOCUMENTS

| | | | | |
|---|---|---|---|---|
| 6,104,074 A | * | 8/2000 | Chen ........................ | 257/453 |
| 6,207,973 B1 | * | 3/2001 | Sato et al. ................. | 257/98 |
| 6,233,264 B1 | * | 5/2001 | Sato ......................... | 372/45 |
| 6,382,800 B2 | * | 5/2002 | Sato .......................... | 257/615 |

FOREIGN PATENT DOCUMENTS

| JP | 10-144611 A | 5/1998 |
|---|---|---|
| JP | 10-270798 A | 10/1998 |

OTHER PUBLICATIONS

Sato et al, "Room–Temperature Pulsed Operation of 1.3 µm GaInNAs/GaAs Laser Diode", *Electronic Letters*, vol. 33, No. 16, Jul. 31, 1997, pp. 1386–1387.

Miyamoto et al, "A Novel GaInNAs–GaAs Quantum–Well Structure for Long–Wavelength Semiconductor Lasers", IEEE *Photonics Technology Letters*, vol. 9, No. 11, Nov. 1997, pp. 1448–1450.

* cited by examiner

*Primary Examiner*—Savitri Mulpuri
(74) *Attorney, Agent, or Firm*—Nixon & Vanderhye P.C.

(57) ABSTRACT

A method for growing a compound semiconductor includes a first formation step of forming a first group III–V compound layer; a second formation step of forming a second group III–V compound layer including nitrogen and at least one group V element other than nitrogen as a group V composition; and a third formation step of forming a third group III–V compound layer between the first group III–V compound layer and the second group III–V compound layer, the third group III–V compound layer being formed for controlling a reactivity of the second group III–V compound layer with a nitrogen source used in the second formation step.

22 Claims, 24 Drawing Sheets

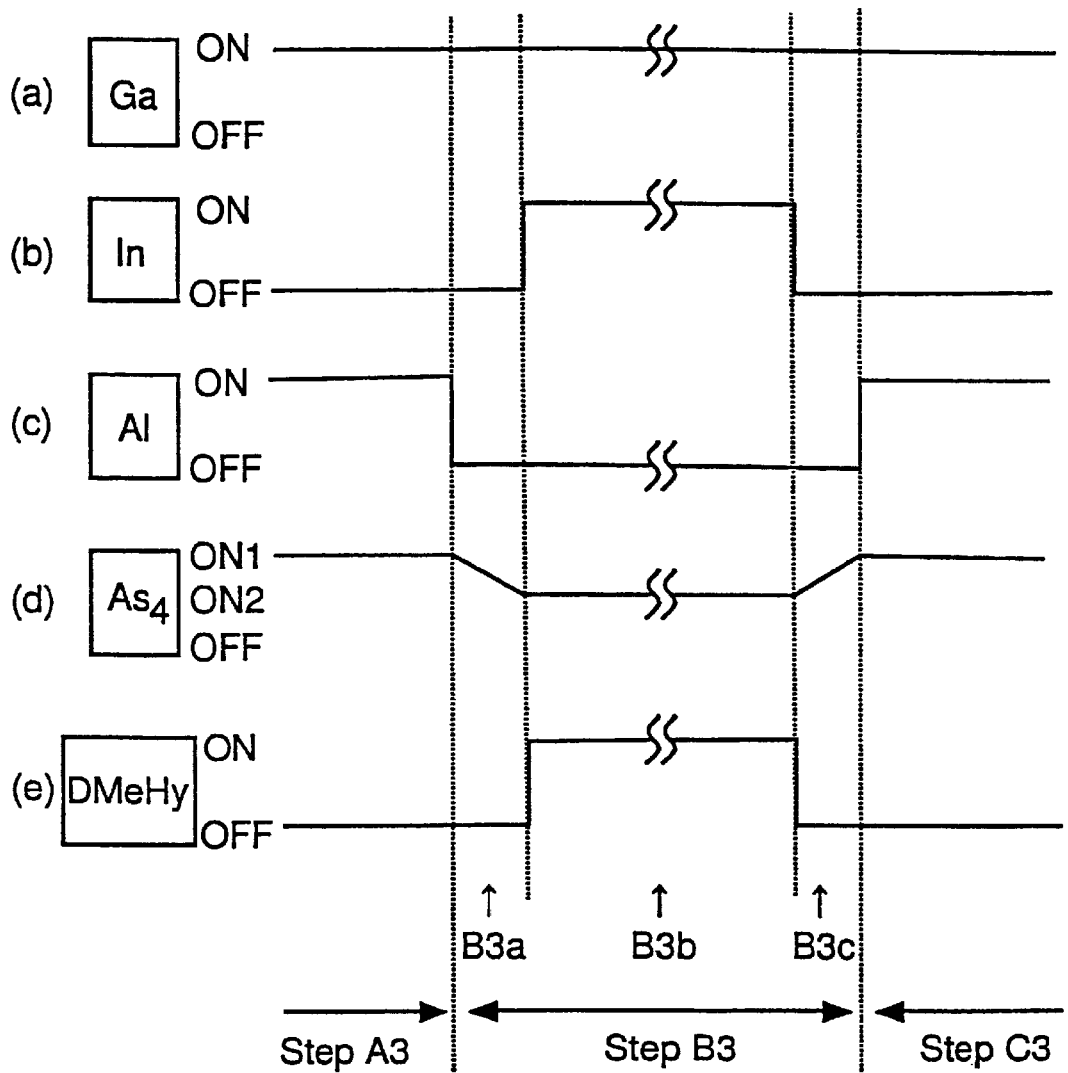

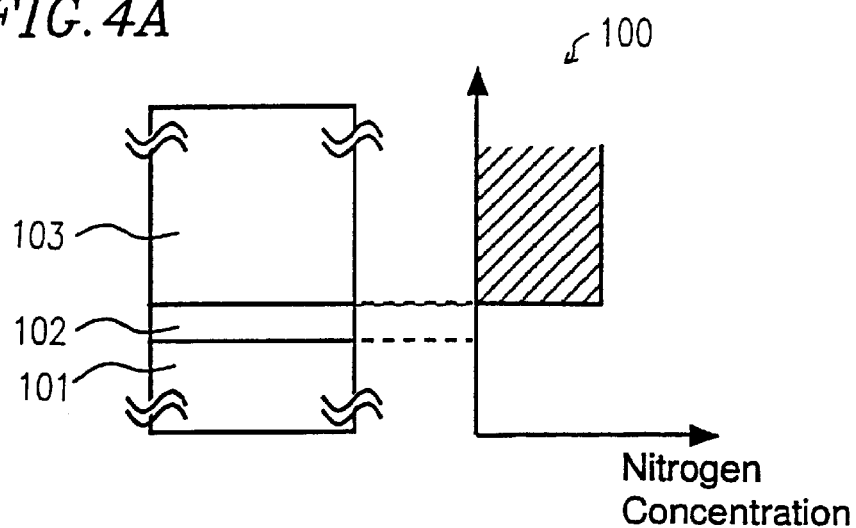
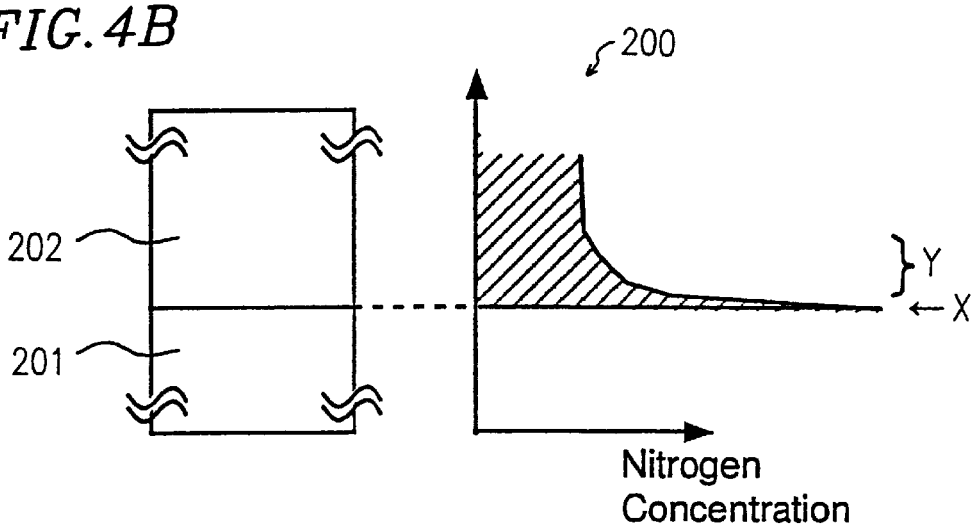
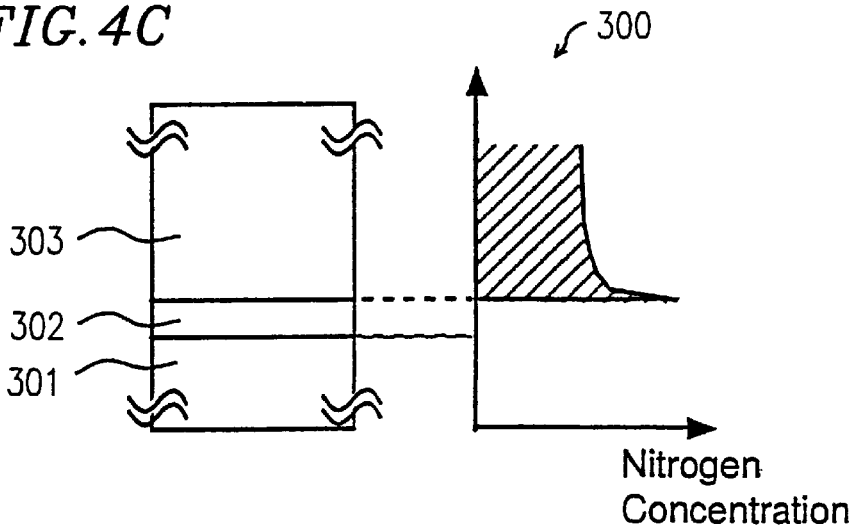

METHOD FOR GROWING A COMPOUND SEMICONDUCTOR, QUANTUM WELL STRUCTURE USING THE SAME, AND COMPOUND SEMICONDUCTOR DEVICE INCLUDING THE SAME

BACKGROUND OF THE INVENTION

1. Field of the Invention

The present invention relates to a method for growing a compound semiconductor including a group III–V compound semiconductor layer which includes nitrogen and a group V element other than nitrogen as a group V composition; a quantum well structure including a group III–V compound semiconductor layer which includes nitrogen and a group V element other than nitrogen as a group V composition: and a compound semiconductor device including such a quantum) well structure.

2. Description of the Related Art

Recently, as group III–V compound semiconductor materials having a significantly wider field of use, group III–V compound semiconductor materials including a group V element other than nitrogen (arsenic (As), phosphorus (P), and antimony (Sb), etc.) and about several percents of nitrogen as a group V composition have been proposed. Nitrogen and group V elements other than nitrogen are significantly different from each other in atom diameter and electronegativity as described below. Due to such a difference, specific physical properties are generated by mixing nitrogen and a group V element other than nitrogen. The atom diameter is 0.070 nm for nitrogen: whereas it is 0.118 nm for arsenic, 0.110 nm for phosphorus, and 0.136 nm for antimony. The electric negativity is 3.5 for nitrogen; whereas it is 2.4 for arsenic, 2.5 for phosphorus, and 2.1 for antimony. For example, GaInNAs having a nitrogen composition ratio of several percents is considered to be obtained by mixing GaInAs and GaInN which has a larger forbidden band width than GaInAs, the GaInN being mixed at a ratio of several percents. However, GaInNAs having a nitrogen composition ratio of several percents has very large bowing on the change of the forbidden band width accompanying the mixing. Accordingly, such GaInNAs has the forbidden band width rapidly narrowed by the mixing although GaInN has a large forbidden band width.

The other physical properties of GaInNAs-based materials, such as refractive index, exhibit a specific behavior of significantly changing when a small amount of nitrogen is mixed. GaInNAS-based materials thus obtained have been found to be the only materials which can be used in a light emitting layer of a light emitting device which emits light having a wavelength of 1.3 $\mu$m or 1.55 $\mu$m (both of which are important for optical fiber communication) or a longer wavelength while being lattice-matched to a GaAs substrate, which is of high quality at low-cost. Accordingly, GaInNAs-based materials have recently become the target of attention industrially as materials to be used for a light emitting device.

By combining a group III–V compound semiconductor material, such as GaInNAs, including nitrogen and a group V element other than nitrogen with another group III–V compound semiconductor material having approximately the same lattice constant (for example, GaAs, AlGaAs, or InGaAsP), a hetero-junction having a very large band discontinuity ($\Delta E_o$) in the valence band can be formed. Therefore, it is predicted that a light emitting device including a light emitting layer formed of GaInNAs efficiently confines electrons injected into the light emitting layer even at a high temperature, and thus has a sufficiently small change in light emitting characteristics depending on temperature.

The hetero-junction is formed by metal organic chemical vapor deposition (MOCVD) or molecular beam epitaxy (MBE). The hetero-junction can also be formed by gas source molecular beam epitaxy (GS-MBE), metal organic molecular beam epitaxy (MO-MBE), chemical molecular beam epitaxy (CBE) or the like.

FIG. 11A shows a quantum well structure 1100 including an AlGaAs lower barrier layer 1101, a GaInNAs well layer 1102, and an AlGaAs upper barrier layer 1103 as a conventional example of a hetero-junction of compound semiconductors (conventional example 1). FIG. 11B shows supply sequences of sources for producing the quantum well structure 1100. In the example shown in FIG. 11B, the compound semiconductor layers are grown by MOCVD, using trimethyl gallium (TMGa), trimethylaluminum (TMAl), trimethyl indium (TMIn), arsine ($AsH_3$), and dimethylhydrazine (DMeHy) as sources of Ga, Al, In, As and N, respectively. As a carrier gas, hydrogen ($H_2$) is used. In FIG. 11, parts (a) through (e) show the supply sequences of the respective sources.

The AlGaAs lower barrier layer 1101 is grown in step M. Then, in step N, only $AsH_3$ is supplied to suppress the vaporization of As, thereby pausing the growth. In this specification, a process of pausing growth will be referred to as a "growth pause". In step O, the GaInNAs well layer 1102 is grown. Then, in step P, only $AsH_3$ is supplied, thereby performing a growth pause. In step Q, the AlGaAs upper barrier layer 1103 is grown. During the growth pause in steps N and P, an optimum supply amount of $AsH_3$ for each of the lower barrier layer 1101, the well layer 1102, and the upper barrier layer 1103 is set. $H_2$ as the carrier gas is supplied at a constant amount throughout the steps M through Q.

Japanese Laid-Open Publication No. 10-144611 (conventional example 2) discloses a supply sequence for suppressing the generation of a metamorphic layer at a hetero-interface of a hetero-junction of layers of different group V compositions. FIG. 12A shows an FET crystal 1200 in conventional example 2 (shown in Japanese Laid-Open Publication No. 10-144611, FIG. 1). The FET crystal 1200 includes a GAs buffer layer 1212, an AlGaAs buffer layer 1213, a GaAs buffer layer 1214, an undoped $Ga_{0.8}In_{0.2}As$ channel layer 1215, an n-type $Ga_{0.5}In_{0.5}P$ electron supply layer 1216, an n-type $Al_{0.2}Ga_{0.8}As$ Schottky layer 1217, and an n-type GaAs cap layer 1218 which are sequentially laminated on a semi-insulating GaAs substrate 1211 in this order.

The FET crystal 1200 is an example of hetero-junction of As-based materials including As as the only group V element (i.e., the undoped $Ga_{0.8}In_{0.2}As$ channel layer 1215 and n-type $Al_{0.2}Ga_{0.8}As$ Schottky layer 1217) and a P-based material including P as the only group V element (i.e., the n-type $Ga_{0.5}In_{0.5}P$ electron supply layer 1216).

FIG. 12B shows supply sequences of sources for forming the undoped $Ga_{0.8}In_{0.2}As$ channel layer 1215, the n-type $Ga_{0.5}In_{0.5}P$ electron supply laster 1216, and the n-type $Al_{0.2}Ga_{0.8}As$ Schottky layer 1217. In the example shown in FIG. 12B, $PH_3$ is used as a P source and $AsH_3$ is used as an As source. In FIG. 12B, parts (a) through (c) shows the supply sequences of a group III element, $PH_3$ and $AsH_3$, respectively.

In step R, the As-based material (undoped $Ga_{0.8}In_{0.2}As$ channel layer 1215) is grown. Then, in steps S through U, a growth pause is performed. In step V, the P-based material (n-type $Ga_{0.5}In_{0.5}P$ electron supply layer 1216) is grown. Then, in steps W through Y, a growth pause is performed. In step Z, the As-based material (n-type $Al_{0.2}Ga_{0.8}As$ Schottky layer 1217) is grown.

In the above-described supply sequences, the two growth pause processes each include three steps, i.e., the step of supplying only the group V element used for growing the layer in the immediately previous step (steps S and W), the step of supplying no material (steps T and X), and the step of supplying only the group V element used for growing the layer in the immediately following step (steps U and Y).

Japanese Laid-Open Publication No. 10-270798 (conventional example 3) discloses a technology aiming at suppressing the formation of a metamorphic layer at a hetero-interface of a hetero-junction of an AlGaAs layer and a GaInNAs layer. FIG. 13 shows a semiconductor light emitting device 1300 in the conventional example 3 (shown in Japanese Laid-Open Publication No. 10-270798; FIG. 2). The semiconductor light emitting device 1300 includes an n-type GaAs buffer 1302, an n-type AlGaAs cladding layer 1303, an AlGaAs guide layer 1304, a GaAs spaces layer 1305, a GaInNAs well layer 1306, a GaAs spacer layer 1307, an AlGaAs guide layer 1308, a p-type AlGaAs cladding layer 1309, a p-type GaAs cap layer 1310, and an insulating layer 1312 which are sequentially laminated on an n-type GaAs substrate 1301 in this order. An n-type electrode 1313 is provided on the n-type GaAs substrate 1301, and a p-type electrode 1311 is provided on the insulating layer 1312.

In general, an AlGaNAs or AlGaInNAs metamorphic layer having an inferior surface state is provided at a hetero-interface between an AlGaAs layer and a GaInNAs layer. In conventional example 3, in order to avoid the generation of the metamorphic layer, the spacer layers 1305 and 1307 are respectively provided between the AlGaAs guide layer 1304 and the GaInNAs well layer 1306 and between the AlGaAs guide layer 1308 and the GaInNAs well layer 1306. The spacer layers 1305 and 1307 are each formed of a thin film having a thickness corresponding to at least one molecule.

Conventional example 3 discloses a hetero-junction structure but does not include any specific description on a method for growing a compound semiconductor, such as supply sequences of sources for compound semiconductor materials.

As described above, superior characteristics such as a characteristic temperature are predicted to be exhibited when a group III–V compound semiconductor layer (e.g., GaInNAs layer) including nitrogen and a group V element other then nitrogen as a group V composition for an active layer of a semiconductor laser device. However, when the above-described conventional methods for growing a compound semiconductor are used to form a quantum well structure in an active layer of a semiconductor laser device, a quantum well formed of GaInNAs including only about 1% of nitrogen does not necessarily provide superior light emitting characteristics to a quantum well formed of GaInNAs including no nitrogen. By contrast, by mixing only about 1% of nitrogen into the well layer, the oscillation threshold current is increased several to several tens of times and the light emission efficiency is reduced several to several tens of times. Group III–V compound semiconductor materials including nitrogen and a group V element other than nitrogen as a group V composition has specific characteristics which are not found in the other materials in the growth mechanism as well as in the physical properties. It is considered to be necessary to select a growth method compatible with the specific characteristics in the growth mechanism in order to produce a crystal and a quantum well structure having sufficient optical gain.

SUMMARY OF THE INVENTION

According to one aspect of the invention, a method for growing a compound semiconductor includes a first formation step of forming a first group III–V compound layer; a second formation step of forming a second group III–V compound layer including nitrogen and at least one group V element other than nitrogen as a group V composition, and a third formation step of forming a third group III–V compound layer between the first group III–V compound layer and the second group III–V compound layer, the third group III–V compound layer being formed for controlling a reactivity of the second group III–V compound layer with a nitrogen source used in the second formation step.

In one embodiment of the invention, the first formation step, the third formation step and the second formation step are performed sequentially in this order.

In one embodiment of the invention, the second formation step is performed continuously after the third formation step.

In one embodiment of the invention, the second formation step, the third formation step and the first formation step are performed sequentially in this order.

In one embodiment of the invention, the third formation step is performed continuously after the second formation step.

In one embodiment of the invention, the first formation step, the third formation step and the second formation step are performed sequentially in this order, and then the third formation step and the first formation step are performed sequentially in this order.

In one embodiment of the invention, the first formation step, the third formation step, the second formation step, the third formation step and the first formation step are continuously performed.

In one embodiment of the invention, a composition of the third group III–V compound layer is determined so that a reactivity of the third group III–V compound layer with the nitrogen source and a reactivity of the second group III–V compound layer with the nitrogen source are substantially equal to each other.

In one embodiment of the invention, the first group III–V compound layer includes at least one of aluminum and indium as a group III composition.

In one embodiment of the invention, the third group III–V compound layer includes at least one group V element other than nitrogen as a group V composition, and the third group III–V compound layer has a group III composition which is substantially equal to a group III composition of the second group III–V compound layer.

In one embodiment of the invention, the third group III–V compound layer has a group III composition ratio which is substantially equal to a group III composition ratio of the second group III–V compound layer.

In one embodiment of the invention, the second group III–V compound layer and the third group III–V compound layer each include indium as a group III composition, and an indium composition ratio of the third group III–V compound layer is in the range of −50% to +50% of an indium composition ratio of the second group III–V compound layer.

In one embodiment of the invention, the second group III–V compound layer and the third group III–V compound layer each include aluminum as a group III composition, and an aluminum composition ratio of the third group III–V compound layer is in the range of −30% to +30% of an aluminum composition ratio of the second group III–V compound layer.

In one embodiment of the invention, the third group III–V compound layer has a thickness which corresponds to one molecule at a minimum and a critical layer thickness at a maximum.

In one embodiment of the invention, the nitrogen source used in the second formation step is a compound expressed by the formula:

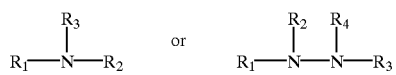

where $R_1$, $R_2$, $R_3$ and $R_4$ are each a hydrogen atom or an arbitrary alkyl group.

According to another aspect of the invention, a quantum well structure produced by any one of the above-described methods is provided. The first group III–V compound layer is a barrier layer and a second group III–V compound layer is a well layer.

According to still another aspect of the invention, a quantum well structure includes a barrier layer including a first group III–V compound layer, a well layer including a second group III–V compound layer including nitrogen and at least one group V element other than nitrogen as a group V composition; and an intermediate layer including a third group III–V compound layer between the barrier layer and the well layer. The third group III–V compound layer includes at least one element other than nitrogen as a group V composition, and the third group III–V compound layer has a group III composition which is substantially equal to a group III composition of the second group III–V compound layer.

In one embodiment of the invention, the third group III–V compound layer has a group III composition ratio which is substantially equal to a group III composition ratio of the second group III–V compound layer.

According to still another aspect of the invention, a compound semiconductor device including at least the above-mentioned quantum well structure is provided. The quantum well structure acts as a light emitting layer.

According to still another aspect of the invention, a compound semiconductor device includes a first group III–V compound layer; a second group III–V compound layer including nitrogen and at least one group V element other than nitrogen as a group V composition, and a third group III–V compound layer provided between the first group III–V compound layer and the second group III–V compound layer. The third group III–V compound layer includes at least one element other than nitrogen as a group V composition, and the third group III–V compound layer has a group III composition which is substantially equal to a group III composition of the second group III–V compound layer.

In one embodiment of the invention, the third group III–V compound layer has a group III composition ratio which is substantially equal to a group III composition ratio of the second group III–V compound layer.

In one embodiment of the invention, the second group III–V compound layer and the third group III–V compound layer each include indium as a group III composition, and an indium composition ratio of the third group III–V compound layer is in the range of −50% to +50% of the indium composition ratio of the second group III–V compound layer.

In one embodiment of the invention, the second group III–V compound layer and the third group III–V compound layer each include aluminum as a group III composition, and an aluminum composition ratio of the third group III–V compound layer is in the range of −30% to +30% of the aluminum composition ratio of the second group III–V compound layer.

A method for growing a compound semiconductor according to the present invention grows an intermediate layer between a layer formed of an AlGaAs-based material, an InGaAsP-based material or the like and a layer including both nitrogen and a group V element other than nitrogen as a group V composition (for example, a GaInNAs layer, an InGaAsPN layer, a GaAsSbN layers or the like). The intermediate layer controls the reactivity of the layer to be grown thereon with a nitrogen source.

The present inventors have found that when a layer including both nitrogen and a group V element other than nitrogen as a group V composition is grown using a nitrogen compound expressed by the formula below as a nitrogen source, the decomposition and adsorption efficiency of the nitrogen source is significantly influenced by the group III composition, the group V composition, the composition ratios, the materials of the layer to be grown, and the materials of a layer below this layer. Based on this finding, the present inventors have provided an intermediate layer to uniformize the nitrogen concentration in the layer to be grown and reduce the generation of the non-light emission centers at a hetero-interface between the layer to be grown and the intermediate layer. As a result, the light emission intensity is improved.

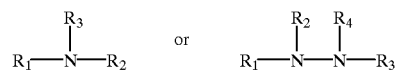

where $R_1$, $R_2$, $R_3$ and $R_4$ are each a hydrogen atom or an arbitrary alkyl group.

Aluminum exhibits a remarkably high reactivity with nitrogen sources, and indium is inactive with respect to nitrogen sources. Accordingly, the effect of the present invention is especially noticeable when either one of the layer to be grown or the layer below this layer includes aluminum or indium.

Thus, the invention described herein makes possible the advantages of providing a method for growing a compound semiconductor, including a group III–V compound semiconductor layer which includes nitrogen and a group V element other than nitrogen as a group V composition, which significantly improves the light emission characteristics and also is effective for forming a hetero-junction of a group III–V compound semiconductor layer which includes nitrogen and a group V element other than nitrogen as a group V composition and a group III–V compound semiconductor layer which does not include nitrogen. The invention described herein also makes possible the advantages of providing a quantum well structure having superior optical gain and superior light emission efficiency, by including a group III–V compound semiconductor layer which includes nitrogen and a group V element other than nitrogen as a group V composition as a well layer and a group III–V compound semiconductor layer which does not include nitrogen as a barrier layer; a method for growing a compound semiconductor which is preferable to form such a quantum welt structure, and a compound semiconductor device including the quantum well structure as an active layer.

These and other advantages of the present invention will become apparent to those skilled in the art upon reading and understanding the following detailed description with reference to the accompanying figures.

BRIEF DESCRIPTION OF THE DRAWINGS

FIG. 3B is a diagram illustrating supply sequences of sources for forming the quantum well structure shown in FIG. 3A:

FIG. 4A is a diagram illustrating a nitrogen concentration distribution in layers of the quantum well structure shown in FIG. 1A:

FIG. 4B is a diagram illustrating a nitrogen concentration distribution in layers of the quantum well structure shown in FIG. 2A;

FIG. 4C is a diagram illustrating a nitrogen concentration distribution in layers of the quantum well structure shown in FIG. 3A;

DESCRIPTION OF THE PREFERRED EMBODIMENTS

Hereinafter, the present invention will be described by way of illustrative examples with reference to the accompanying drawings.

In this specification, a composition ratio of an element means a ratio of that element with respect to the total amount of the group to which that element belongs to. For example, the expression "Al composition ratio of the intermediate layer" means the composition ratio of Al with respect to the total amount of the group III elements contained in the intermediate layer.

EXAMPLE 1

According to a first example of the present invention, a single quantum well structure including an AlGaAs barrier layer and a GaInNAs well layer is grown on a GaAs substrate. In this example, the GaInNAs well layer is formed on the AlGaAs barrier layer by first supplying a Ga source, an In source, and an As source and then a prescribed time period later, supplying an N source. Thus, an intermediate layer formed of GaInAs is provided between the AlGaAs barrier layer and the GaInNAs well layer.

Figure 1A:
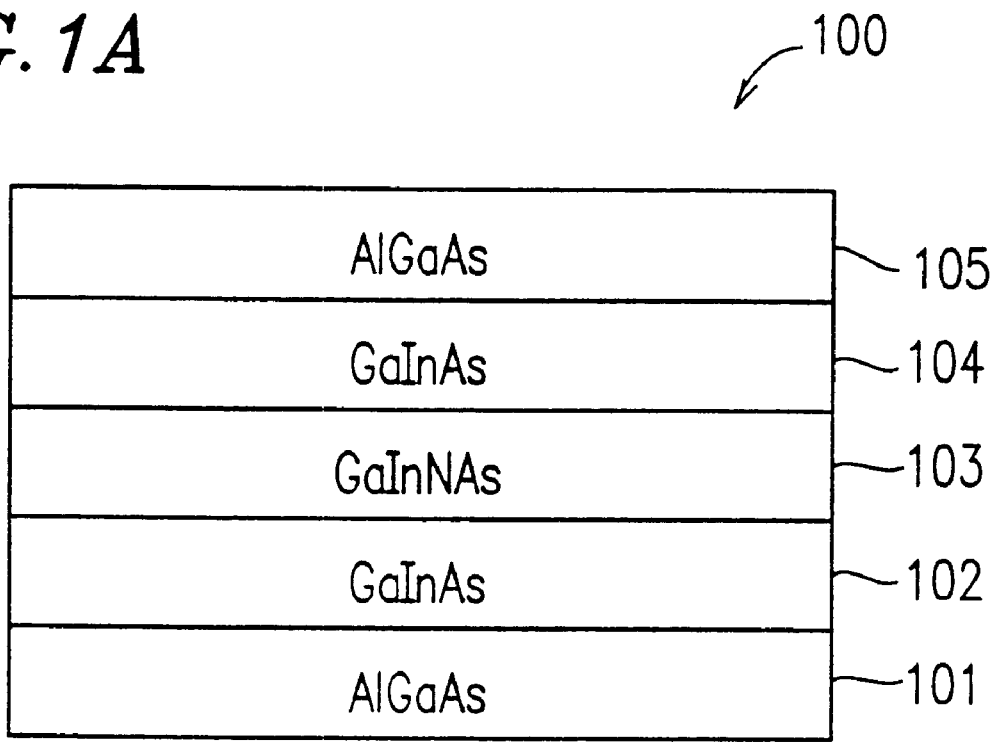
FIG. 1A is a schematic view illustrating a quantum well structure according to a first example of the present invention.

FIG. 1A shows a structure of a single quantum well structure 100 according to the first example. The quantum well structure 100 includes an AlGaAs lower barrier layer 101, a GaInAs intermediate layer 102, a GaInNAs well layer 103, a GaInAs intermediate layer 104, and an AlGaAs upper barrier layer 105.

The single quantum well structure 100 is grown on a GaAs (100) substrate (not shown) by gas source MBE, using metal Ga, metal In, metal Al, metal As ($As_4$) and DMeHy (dimethylhydrazine) as sources of Ga, In, Al, As and N, respectively. Only DMeHy is a gas source. The temperature of the GaAs substrate during the growth is set to be 550° C.

Figure 1B:
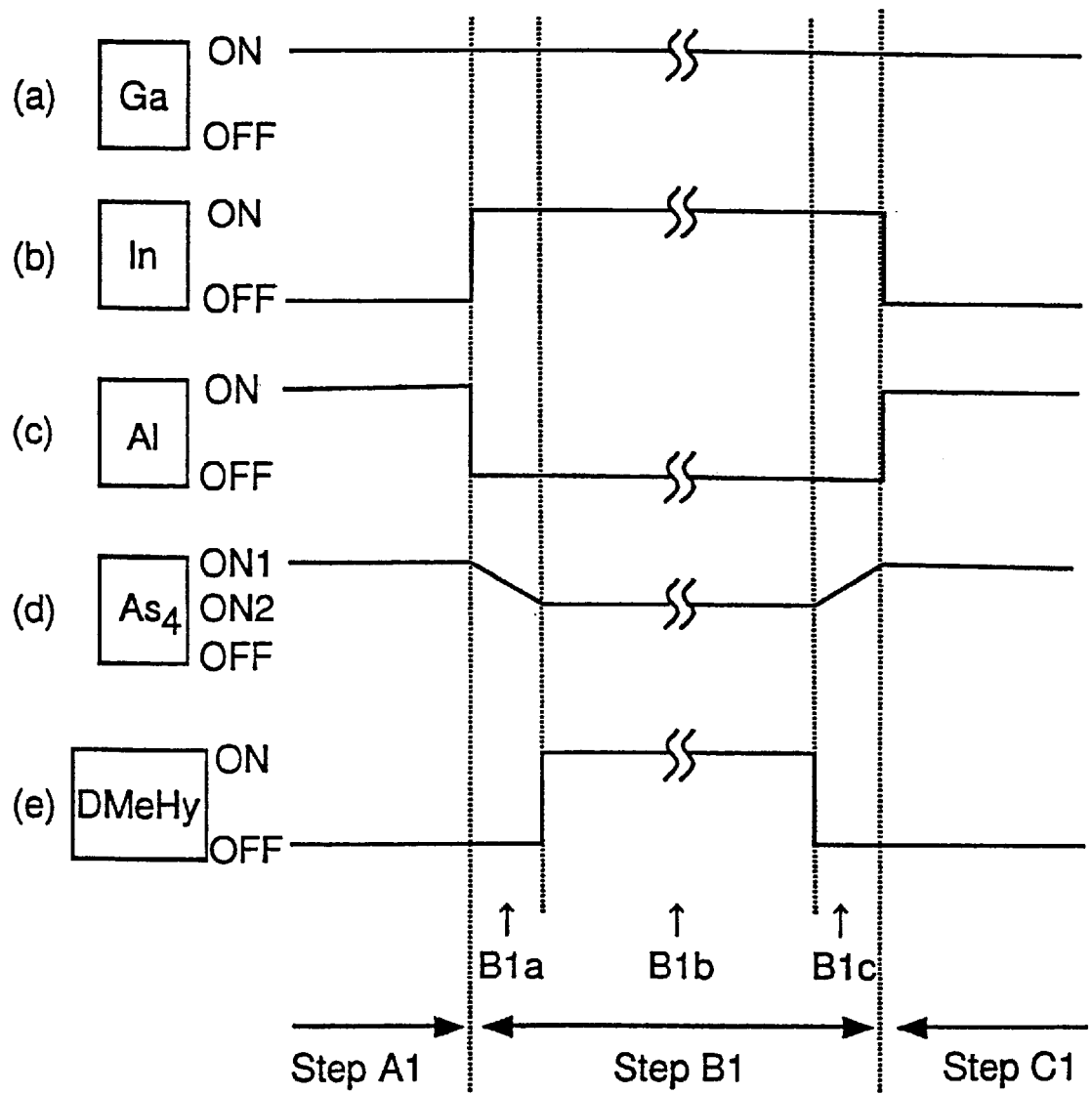
FIG. 1B is a diagram illustrating supply sequences of sources for forming the quantum well structure shown in FIG. 1A.

FIG. 1B shows supply sequences of sources for forming the quantum well structure 100. In FIG. 1B, parts (a) through (e) of FIG. 1B show the supply sequences of the respective sources. The quantum well structure 100 is produced in steps A1, B1 and C1.

In step A1, the $Al_{0.3}Ga_{0.7}As$ lower barrier layer 101 is grown to about 0.2 μm. At this point, the beam equivalent pressures of Al, Ga and $As_4$ are respectively set to be $7.8\times10^{-8}$ torr, $2.9\times10^{-7}$ torr, and $1.4\times10^{-5}$ torr. The growth time period is set to be 20 minutes.

Step B1 includes three steps of B1a, B1b and B1c. In step B1a, Ga, In and As beams are supplied for about 4 seconds continuously, i.e., with no growth pause, after the growth of the lower barrier layer 101 in step A1. Thus, the GaInAs intermediate layer 102 is formed. Then, in step B1b, a DMeHy beam as a nitrogen source is introduced for about 60 seconds, thereby forming the $Ga_{0.7}In_{0.3}N_{0.01}As_{0.99}$ well layer 103 to a thickness of about 8 nm. In step B1c, Ga, In and As beams are supplied for about 4 seconds, thereby forming the GaInAs intermediate layer 104. Thus, step B1 is completed. The beam equivalent pressures of Ga, In, $As_4$ and DMeHy in step B1b are respectively set to be $2.9\times10^{-7}$ torr, $1.2\times10^{-7}$ torr, $8.0\times10^{-6}$ torr, and $4.0\times10^{-5}$ torr. The supply amount of the $As_4$ beam is different among steps A1, C1 and B1b. In step B1A between steps A1 and B1b and in step B1c between steps B1b and C1, the supply amount of the $As_4$ beam is changed with no growth pause. $As_4$ is supplied using a source cell with a valve, and thus the supply amount of $As_4$ can be changed instantaneously, within 1 second.

In step C1, the $Al_{0.3}Ga_{0.7}As$ upper barrier layer 105 is grown to a thickness of about 0.2 μm continuously, i.e., with no growth pause, after step B1. At this point, the beam equivalent pressures of Al, Ga and $As_4$ are respectively set to be $7.8\times10^{-8}$ torr, $2.9\times10^{-7}$ torr, and $1.4\times10^{-5}$ torr. The growth time period is set to be 20 minutes.

Comparative Example 1

Figure 2A:
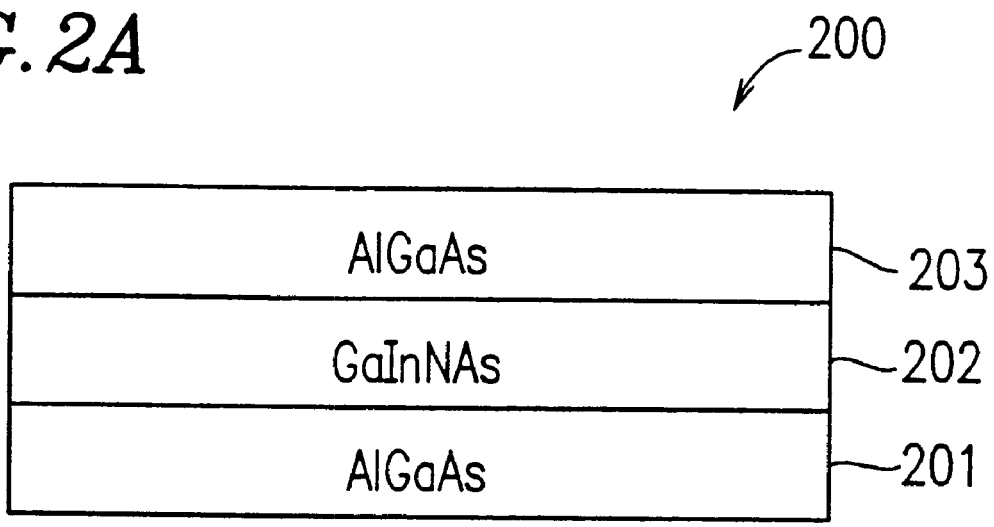
FIG. 2A is a schematic view illustrating a quantum welt structure according to comparative example 1.

FIG. 2A shows a quantum well structure 200 in comparative example 1. The-quantum well structure 200 includes an AlGaAs lower barrier layer 201, a GaInNAs well layer 202, and an AlGaAs upper barrier layer 203.

Figure 2B:
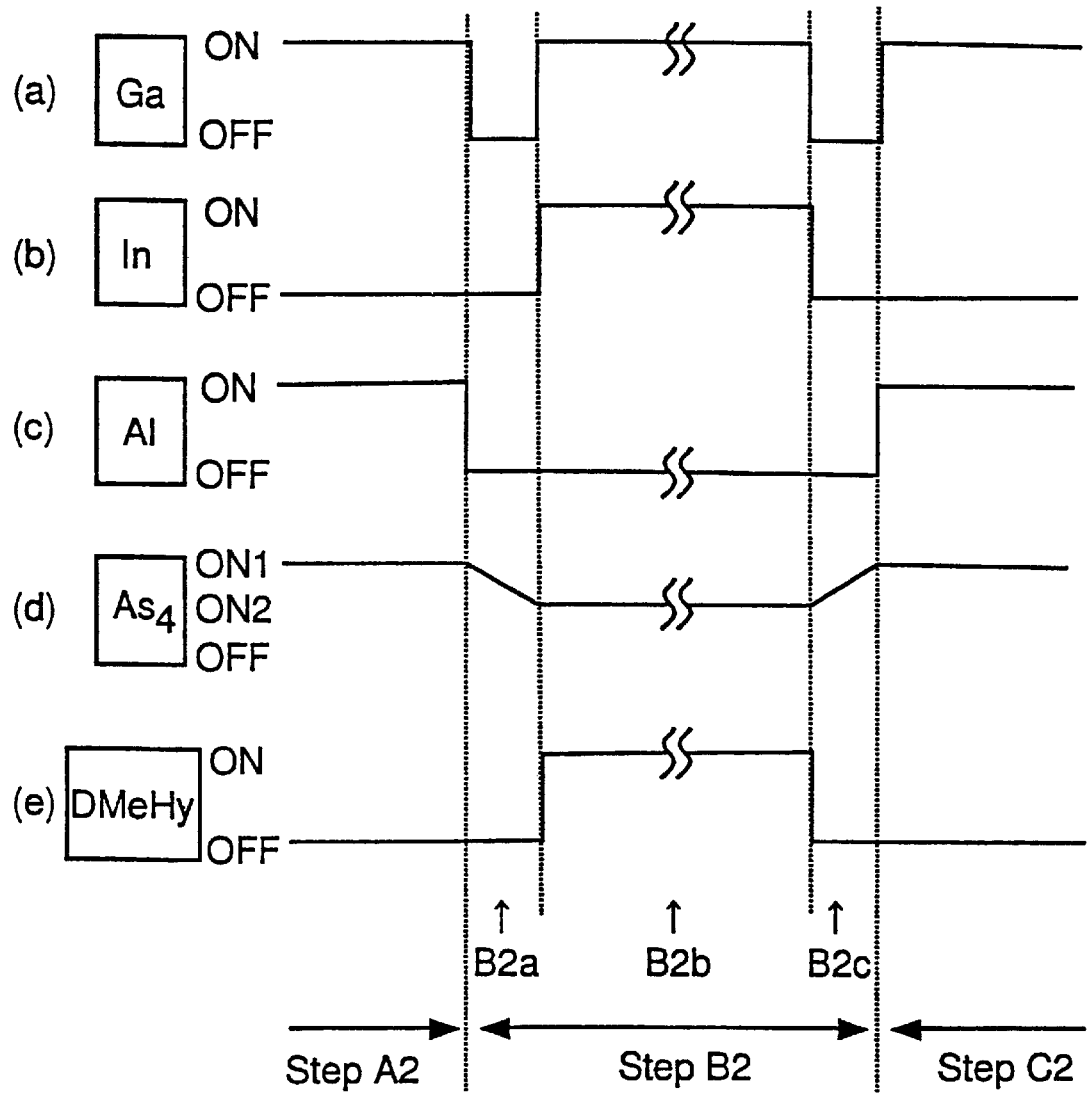
FIG. 2B is a diagram illustrating supply sequences of sources for forming the quantum well structure shown in FIG. 2A.

FIG. 2B shows supply sequences of sources for forming the quantum well structure 200. In FIG. 2B, parts (a) through (e) shows the supply sequences of the respective sources. The quantum well structure 200 is formed with the identical parameters such as, for example, the growth method, the supply amounts of source beams, and the substrate temperature, with those of the quantum well structure 100 in the first example except that the intermediate layers 102 and 104 are not formed in the quantum well structure 200. The supply sequences shown in FIG. 23 include the growth pause processes conventionally performed.

In step A2, the $Al_{0.3}Ga_{0.7}As$ lower barrier layer 201 is grown to a thickness of about 0.2 μm.

Step B2 includes three steps of B2a, B2b and B2c. In step B2a, the supply of the group III elements is stopped to pause the growth for 4 seconds after the lower barrier layer 201 is grown in step A2. (Only $As_4$ is continuously supplied for the reason described below.) In step B2b, the sources required for growing the well layer 202 are concurrently started to be supplied. The sources are supplied for about 60 seconds, thereby forming the $Ga_{0.7}In_{0.3}N_{0.01}As_{0.99}$ well layer 202 having a thickness of about 8 nm. Then, in step B2c, the supply of the group III elements is stopped to pause the growth for about 4 seconds. (Only $As_4$ is continuously supplied for the reason described below.)

The supply amount of the $As_4$ beam is different among steps A2, C2 and B2b. In step B2a between steps A2 and B2b and in step B2c between steps B2b and C2 (when no group III element is supplied), the supply amount of the $AS_4$ beam is changed with no growth pause. In steps B2a and B2c, only $As_4$ is continuously supplied in order to restrict the vaporization of As atoms, which have a low vapor pressure, during the growth pause.

In step C2, the $Al_{0.9}Ga_{0.7}As$ upper barrier layer 203 is grown to a thickness of about 0.2 μm.

Comparative Example 2

Figure 3A:
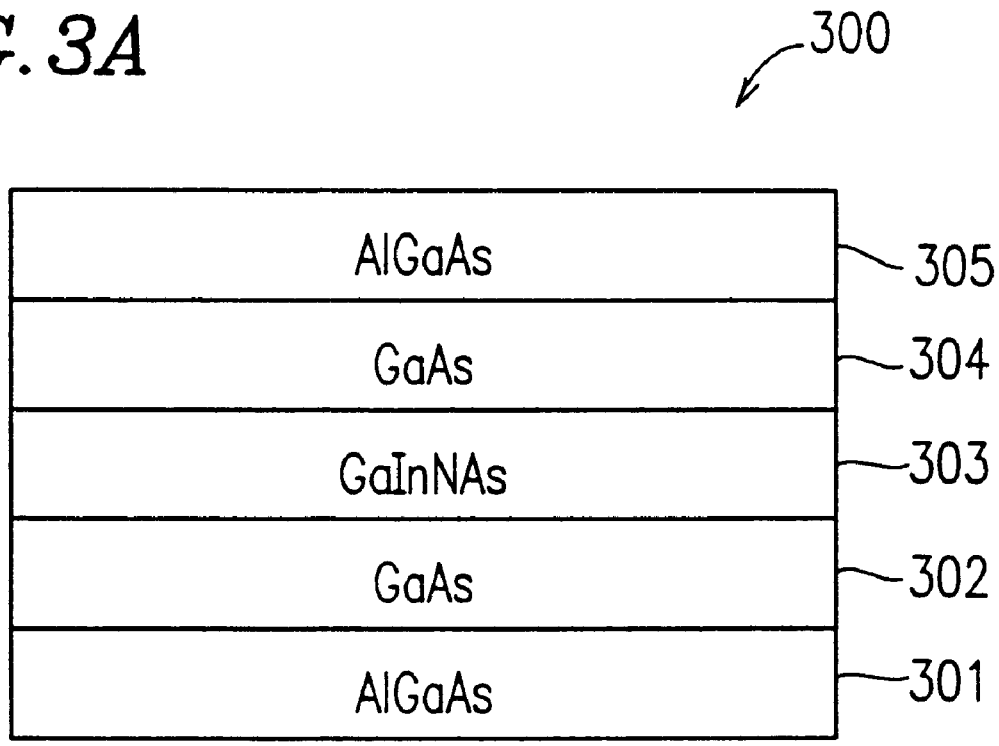
FIG. 3A is a schematic view illustrating a quantum well structure according to comparative example 2.

FIG. 3A shows a quantum well structure 300 in comparative example 2. The quantum well structure 300 includes an AlGaAs lower barrier layer 301, a GaAs intermediate layer 302, a GaInNAs well layer 303, a GaAs intermediate layer 304, and an AlGaAs upper barrier layer 305.

FIG. 3B shows supply sequences of sources for forming the quantum well structure 300. In FIG. 35, parts (a) through (e) show the supply sequences of the respective sources. The quantum well structure 300 is formed with the identical parameters such as, for example, the growth method, the supply amounts of source beams, and the substrate temperature, with those of the quantum well structure 100 in the first example except that the intermediate layers 302 and 304 are formed of GaAs in the quantum well structure 300.

In step A3, the $Al_{0.3}Ga_{0.7}As$ lower barrier layer 301 is grown to a thickness of about 0.2 μm.

Step B3 includes three steps of B3a, B3b and B3c. In step B3a, only Ga and $As_4$ are supplied for about 4 seconds, thereby growing the GaAs intermediate layer 302. In step B3b, In and N (source: DMeHy) are introduced and grown for about 60 seconds, thereby forming the $Ga_{0.7}In_{0.3}N_{0.01}As_{0.99}$ well layer 303 having a thickness of about 7.5 μm. Then, in step B3c, only Ga and $As_4$ are supplied for about 4 seconds, thereby growing the GaAs intermediate layer 304. The supply amount of the $As_4$ beam is different among steps A3, C3 and B3b. In step B3a between steps A3 and B3b and in step B3c between steps B3b and C3, the supply amount of the $As_4$ beam is changed with no growth pause.

In step C3, the $Al_{0.3}Ga_{0.7}As$ upper barrier layer 305 is grown to a thickness of about 0.2 μm.

It is observed that at room temperature, the single quantum well structures 100, 200 and 300 respectively produced in the first example, comparative example 1 and comparative example 2 perform photoluminescence (PL) emission having a wavelength of 1.3 μm. Table 1 shows the PL emission intensity and the full width at half maximum (FWHM) of the PL emission peak measured. In Table 1, the PL emission intensity is shown as the relative value to the PL emission intensity obtained in the first example, which is set to be 100.

TABLE 1

|  | Example 1 | Comparative example 1 | Comparative example 2 |
| --- | --- | --- | --- |
| PL emission intensity | 100 | 0.28 | 13 |
| PL emission peak FWHM | 20 meV | 60 meV | 48 meV |

The quantum well structure 100 in the first example according to the present invention provides sharp light having a wavelength of 1.3 μm and a sufficiently narrow FWHM. The quantum well structure 200 in comparative example 1, which is produced by a production method including growth pause processes, provides a light intensity which is lower than that of the quantum well structure 100 by about two digits and a undesirably wide FWHM. The quantum well structure 300 in comparative example 2, which is produced by a production method not including any growth pause process and using GaAs for the intermediate layers, exhibits improvement in the light emitting characteristics as compared to those of the quantum well structure 200 in comparative example 1, but the light emitting characteristics of the quantum well structure 300 are still inferior to those of the quantum well structure 100.

The function and effect of the first example of the present invention will be described as compared with comparative examples 1 and 2.

As sources of nitrogen used for growing a CaInNAs well layer, a gas source, such as, for example, DMeHy or $NH_3$ (ammonia), is used. The present inventors have found that when such a gas source is used as a nitrogen source, the manner of decomposition and adsorption of the nitrogen source on a surface of the substrate significantly varies in accordance with the group III composition or group V composition of the layer below the layer to be grown, or the type and amount of the group III element provided concurrently with nitrogen.

More specifically, when group III elements provided concurrently with nitrogen include aluminum, the decomposition and adsorption efficiency of the nitrogen source is very high. When the layer below the layer to be grown includes aluminum also, the decomposition and adsorption efficiency of the nitrogen source is very high.

By contrast, when group III elements provided concurrently with nitrogen include indium, the decomposition and adsorption efficiency of the nitrogen source is very low. When the layer below the layer to be grown includes indium also, the decomposition and adsorption efficiency of the nitrogen source is very low.

When the layer below the layer to be grown includes a nitride compound such as GaN as a group V composition, the decomposition and adsorption efficiency of the nitrogen source is relatively high. By contrast, when the layer below the layer to be grown includes a material, such as GaAs or GaP, including the same group III composition as that of the layer to be grown but does not include nitrogen as a group V composition, the decomposition and adsorption efficiency of the nitrogen source is very low. When the layer below the layer to be grown includes a material, such as GaNAs or GaPN having a relatively low nitrogen composition ratio (about 5% or less), including nitrogen substituting a portion of the group V composition, the decomposition and adsorption efficiency of the nitrogen source is low as in the case of using GaAs or GaP.

The present invention provides novel knowledge regarding the characteristics of the growth of such GaInNAs-based materials. More specifically, according to the present invention, the nitrogen concentration can be uniformized from the interface between the GaInNAs well layer and the layer below the GaInNAs well layer to the inside of the GaInNAs layer, by controlling the decomposition and adsorption efficiency of the nitrogen source at the interface and in the initial growth region. Thus, the light emission efficiency of the quantum well structure can be improved.

FIGS. 4A, 4B and 4C schematically show the nitrogen concentration distribution at and in the vicinity of the interface between the lower barrier layer and the well layer in the quantum well structures 100, 200 and 300.

FIG. 4A shows the quantum well structure 100 in the first example. Before the GaInNAs well layer 103 is grown on the AlGaAs lower barrier layer 101 which is grown in step A1, a surface of the AlGaAs lower barrier layer 101 is covered with the GaInAs intermediate layer 102 in step B1a, and then DMeHy as the nitrogen source is introduced in step B1b to grow the GaInNAs well layer 103.

In step B1a, the GaInAs intermediate layer 102 has a thickness corresponding to two molecules. The surface of the lower barrier layer 101 below the GaInNAs well layer 103 is covered with the GaInAs intermediate layer 102 having the same group III composition as that of the GaInNAs well layer 103 which is to be grown. By this process, the decomposition and adsorption efficiency of the nitrogen source at the initial growth stage (when the supply of the nitrogen source is started) becomes approximately the same as that at a later stage of growth of the GaInNAs well layer 103. Accordingly, the nitrogen concentration is uniformized from the vicinity of the interface between the GaInNAs well layer 103 and the GaInAs intermediate layer 102 to a central region of the GaInNAs well layer 103. Although the GaInNAs well layer 103 and the GaInAs intermediate layer 102 have different group V compositions from each other, the nitrogen composition ratio in the GaInNAs well layer 103 is about 1% at most and thus the influence of nitrogen is relatively small. Accordingly, the growth of the GaInNAs well layer 103 proceeds at the decomposition and adsorption efficiency of the nitrogen source which is determined by the group III composition ratios of the GaInNAs well layer 103, the layer below the GaInNAs well layer 103, and the interface therebetween (in the case of the first example, the In composition). Thus, sharp light emission having a narrow FWHM is observed between quantum levels of the quantum well structure 100.

FIG. 4B shows the quantum well structure 200 in comparative example 1. The GaInNAs well layer 202 is grown by concurrently starting supply of all of the sources to the AlGaAs lower barrier 201. As a result of an experiment performed by the present inventors, it has been found that the nitrogen composition ratio is significantly high at the hetero-interface between the AlGaAs lower barrier layer 201 and the GaInNAs well layer 202 (indicated by "X" in FIG. 4B) for the following reason. Since the AlGaAs lower barrier layer 201 below the GaInNAs well layer 202 includes aluminum having a high reactivity with DMeHy, the decomposition and adsorption efficiency of the nitrogen source at the hetero-interface is significantly high. As a result, a region having an excessively high nitrogen concentration, which is close to that of a nitride, is generated at the hetero-interface. In a region of the GaInNAs well layer 202 above the hetero-interface having such a high nitrogen concentration, the decomposition and adsorption efficiency of the nitrogen source is relatively high. Accordingly, in a region of the GaInNAs well layer 202 above this region, the nitrogen concentration is higher than a set value. Then, as the GaInNAs well layer 202 grows, the nitrogen concentration is reduced (as indicated by "Y" in FIG. 4B). Therefore, the nitrogen concentration cannot be uniformized in the GaInNAs well layer 202.

Compound semiconductors including a group III–V compound semiconductor layer such as, for example, a GaInNAs layer, including both nitrogen and a group V element other than nitrogen have specific physical properties such as, for example, the forbidden band width and the refractive index significantly changing due to a slight change in the nitrogen composition ratio. Accordingly, the characteristics of the compound semiconductors are adversely influenced by a fluctuation in the nitrogen composition ratio in a III–V compound semiconductor layer much more seriously than the characteristics of other types of semiconductors are influenced by a fluctuation in the ratio of other types of materials. Specifically, in the case of a GaInNAs layer, the change ratio of the forbidden band width with respect to the In composition ratio is about −1.1 eV/In composition ratio, whereas the change ratio of the forbidden band width with respect to the N composition ratio is about −15.5 eV/N composition ratio. The change ratio with respect to the N composition ratio is larger than the change ratio with respect to the In composition ratio by one digit or more. Thus, the forbidden bandwidth significantly changes in accordance with a slight change in the N composition ratio.

Typically, when the GaInNAs layer is used for the active layer of a semiconductor laser device, a GaInNAs layer having a thickness of about 6 to 8 nm is used as the quantum well layer and the quantum well structure is formed by a hetero-junction using a GaAs or AlGaAs layer as the barrier layer. The GaInNAs well layer has a small thickness corresponding to about 20 to 30 molecules. The inter-quantum level transition PL emission having high gain cannot be expected unless the GaInNAs well layer has a precisely controlled and uniformized nitrogen concentration from the vicinity of the hetero-interface to the inside of the GaInNAs well layer.

According to the first example of the present invention, the problems caused by the production of a hetero-junction using a GaInNAs-based material and the rapid change in the physical property values due to the N composition ratio which is specific to GaInNAs-based materials are solved. Therefore, satisfactory light emission characteristics are provided. In the region including nitrogen at a high concentration indicated by "X" in FIG. 4B, the lattice constant is largely offset from that of the substrate, and therefore has many lattice defects, and thus many non-light emission centers are generated. According to the first example of the present invention, such non-light emission centers are not generated, and thus the PL emission intensity is significantly improved.

FIG. 4C shows the quantum well structure 300 in comparative example 2. The light emission characteristics in conventional example 2 are inferior to those of the first example, but are superior to those of comparative example 1. In comparative example 1, the GaInNAs well layer 202 including indium having a low reactivity with the nitrogen source is directly grown on the lower barrier layer 201 including aluminum having a high reactivity with the nitrogen source. As a result, the regions having a high nitrogen concentration (indicated with "X" and "Y" in FIG. 43) are generated in the vicinity of the interface between the lower barrier layer 201 and the well layer 202. In comparative example 2, the GaAs intermediate layer 302 which has a lower reactivity with the nitrogen source than that of the AlGaAs lower barrier layer 201 in conventional example 1 and does not include aluminum is used as the layer below the well layer 303. Accordingly, as shown in FIG. 4C, the region having a high nitrogen concentration in the vicinity of the interface is considered to be smaller than that in the conventional example 1. However, the reactivity with the nitrogen source is lower even in the growing GaInNAs well layer 303 including In than at the interface between the GaInNAs well layer 303 and the GaAs intermediate layer 302. Therefore, the nitrogen concentration cannot be completely uniformized.

As a result of studies, the present inventors have found that the light emission characteristics of the hetero-junction of a GaAs layer and a GaInNAs layer including In is significantly improved by using a GaInAs layer as an intermediate layer even when the GaAs lower barrier layer does not include aluminum.

Figure 5A:
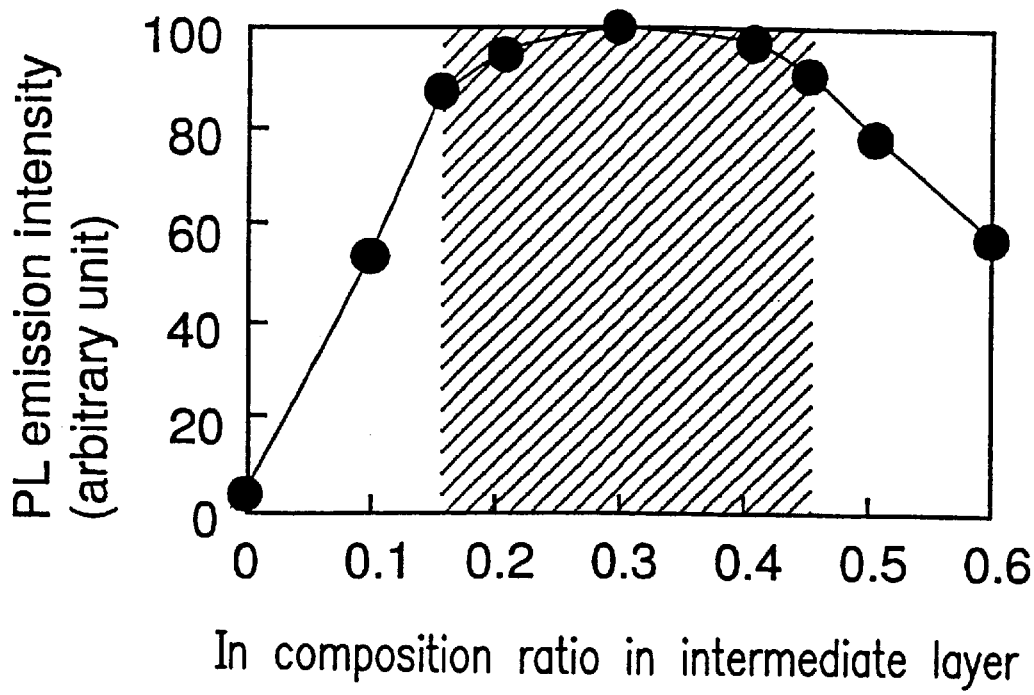
FIG. 5A is a graph illustrating the correlation between the in composition ratio of the intermediate layer and the PL emission intensity of the quantum well structure in the first example of the present invention.

In the first example, before growing the $Ga_{0.7}In_{0.3}N_{0.01}As_{0.99}$ well layer 103 on the $Al_{0.3}Ga_{0.7}As$ lower barrier layer 101 formed in step A1, the $Ga_{0.7}In_{0.3}As$ intermediate layer 102 having the same In composition ratio as that of the $Ga_{0.7}In_{0.3}N_{0.01}As_{0.99}$ well layer 103 is formed on the $Al_{0.3}Ga_{0.7}As$ lower barrier layer 101. The In composition ratio of the GaInAs intermediate layer 102 does not need to completely match the In composition ratio of the GaInNAs well layer 103 to be formed thereon. FIG. 5A shows the correlation between the In composition ratio of the intermediate layer 102 and the PL emission intensity of the quantum well structure. Here, the In composition ratio of the well layer 103 is 0.3. The PL emission intensity of the quantum well structure is maximum when the In composition ratio of the intermediate layer 102 is exactly the same as that of the well layer 103 growing thereon (0.3). As long as the In composition ratio is within the range of 0.15 to 0.45, the reduction in the PL emission intensity is only by 10% at most. It is appreciated from these results that the In composition ratio of the intermediate layer 102 is in the range of −50% to +50% of the In composition ratio of the well layer 103.

The above-described effect is provided when the intermediate layer 102 has a thickness of about 8 nm or less. This thickness is approximately the same as the critical thickness of the intermediate layer 102.

EXAMPLE 2

According to a second example of the present invention, a single quantum well structure including an AlGaAs barrier layer and an AlGaAsN well layer is grown on a GaAs substrate. In the first example, the lower barrier layer includes AlGaAs (or GaAs) and the intermediate layer provided thereon includes indium having a low reactivity with the nitrogen source; whereas in the second example, the lower barrier layer and the layer to be grown on the lower barrier layer (including nitrogen) both include aluminum but at different aluminum composition ratios.

Figure 6A:
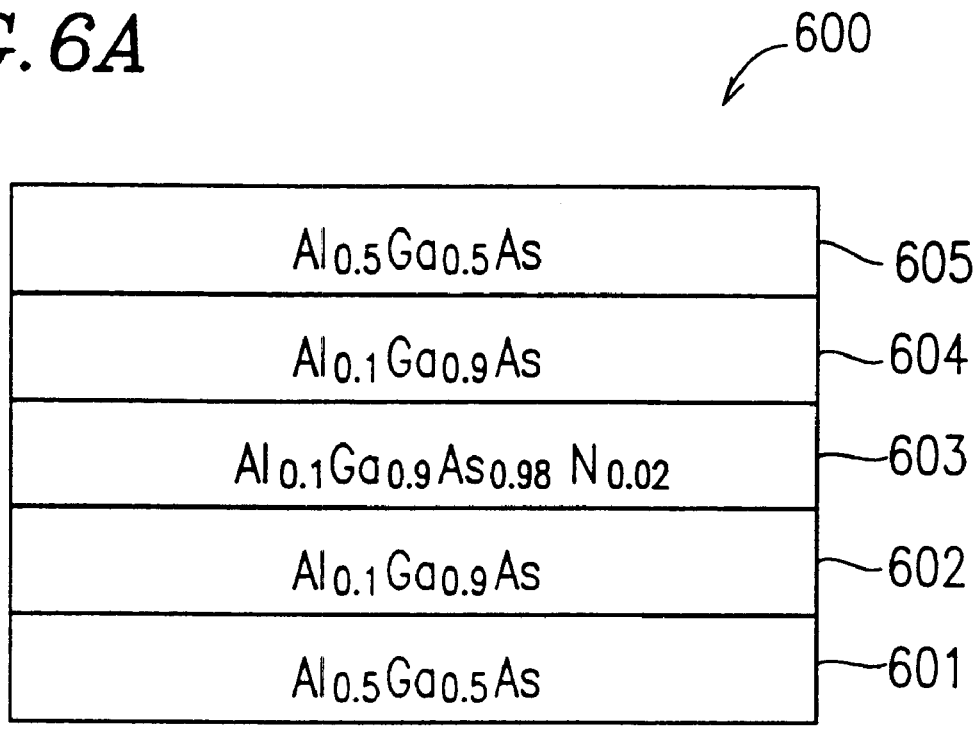
FIG. 6A is a schematic view illustrating a quantum well structure according to the second example of the present invention.

FIG. 6A shows a structure of a single quantum well structure 600 in the second example. The quantum well structure 600 includes an $Al_{0.5}Ga_{0.5}As$ lower barrier layer 601, an $Al_{0.1}Ga_{0.9}As$ intermediate layer 602, an $Al_{0.1}Ga_{0.9}As_{0.98}N_{0.02}$ well layer 603, an $Al_{0.1}Ga_{0.9}As$ intermediate layer 604, and an $Al_{0.5}Ga_{0.5}As$ upper barrier layer 605.

The single quantum well structure 600 is grown on a GaAs (100) substrate (not shown) by gas source MBE, using metal Ga, metal Al, metal As ($As_4$) and $NH_3$ (ammonia) as sources of Ga, Al, As and N, respectively. Only $NH_3$ is a gas source. For Al, two source cells are provided. Hereinafter, the metal Al used for growing the well layer 603 and the intermediate layers 602 and 604 will be referred to as "Al(1)", and the metal Al used for growing the barrier layers 601 and 605 will be referred to as "Al(2)". The temperature of the GaAs substrate during the growth is set to be 500° C.

Figure 6B:
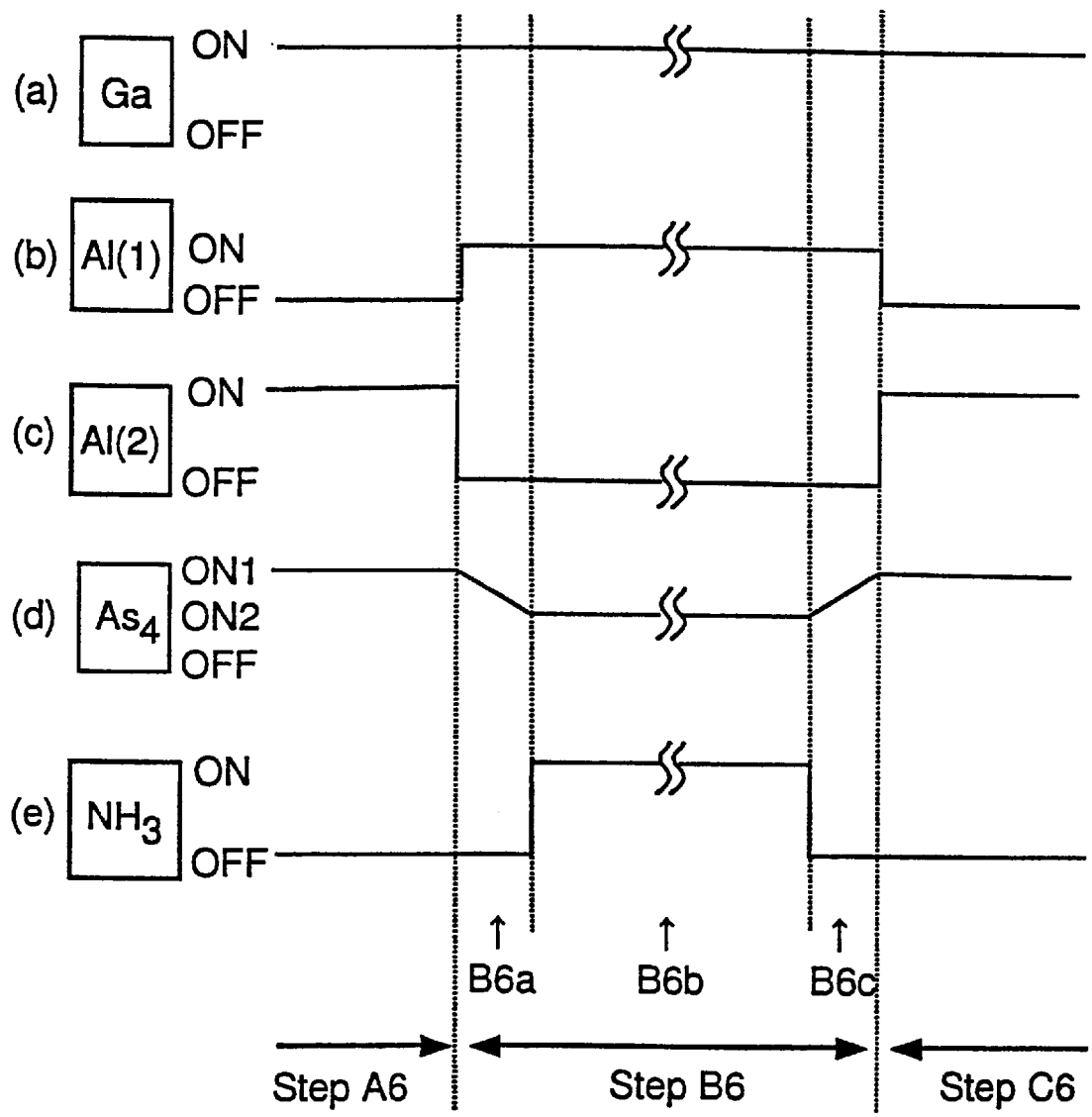
FIG. 6B is a diagram illustrating supply sequences of sources for forming the quantum well structure shown in FIG. 6A.

FIG. 6B shows supply sequences of sources for forming the quantum well structure 600. In FIG. 6B, parts (a) through (e) show the supply sequences of the respective sources. The quantum well structure 600 is produced by steps A6, D6 and C6.

In step A6, the $Al_{0.5}Ga_{0.5}As$ lower barrier layer 601 is grown to about 0.2 μm. At this point, the beam equivalent pressures of Al(2), Ga and $As_4$ are respectively set to be $1.7 \times 10^{-7}$ torr, $2.9 \times 10^{-7}$ torr, and $2.5 \times 10^{-5}$ torr. The growth time period is set to be 15 minutes.

Step B6 includes three steps of B6a, B6b and B6c. In step B6a, Ga, Al(1) and As beams are supplied for about 2 seconds continuously, i.e., with no growth pause, after the growth of the lower barrier layer 601 in step A6. Thus, the $Al_{0.1}Ga_{0.9}As$ intermediate layer 602 is formed. Continuously, in step B6b, an $NH_3$ beam as a nitrogen source is introduced for about 60 seconds, thereby forming the $Al_{0.1}Ga_{0.9}As_{0.98}N_{0.02}$ well layer 603 to a thickness of about 9 nm. In step B6c, Ga, Al(1) and As beams are supplied for about 2 seconds, thereby forming the $Al_{0.1}Ga_{0.9}As$ intermediate layer 604. Thus, step B6 is completed. The beam equivalent pressures of Ga, Al(1) $As_4$ and $NH_3$ in step B6b are respectively set to be $2.9\times10^{-7}$ torr, $2.1\times10^{-6}$ torr, $8.0\times10^{-6}$ torr, and $5.5\times10^{-6}$ torr. The supply amount of the $As_4$ beam is different among steps A6, C6 and B6b. In step B6a between steps A6 and B6b and in stop B6c between steps B6b and C6, the supply amount of the $As_4$ beam is changed with no growth pause. $As_4$ is supplied using a source cell with a valve, and thus the supply amount of $As_4$ can be changed instantaneously, within 1 second.

In step C6, the $Al_{0.5}Ga_{0.5}As$ upper barrier layer 605 is formed to a thickness of about 0.2 μm continuously, i.e., without no growth pause, after step B6. At this point, the beam equivalent pressures of Al(2), Ga and $As_4$ are respectively set to be $1.7\times10^{-7}$ torr, $2.9\times10^{-7}$ torr, and $2.5\times10^{-5}$ torr. The growth time period is set to be 15 minutes.

It is observed that at room temperature, the single quantum wall structure 600 thus produced performs PL emission having a wavelength of 1.0 μm. The PL emission intensity at this point is sufficiently high, and the FWHM of the PL emission peak is as narrow as 23 meV. As can be appreciated from these numerical values, the PL emission is sufficiently sharp.

For comparison, a quantum well structure including an $Al_{0.5}Ga_{0.5}As$ barrier layer and an $Al_{0.1}Ga_{0.9}As_{0.98}N_{0.02}$ well layer which directly contact each other is produced, and the PL emission characteristics of the comparative quantum well structure are measured. The PL emission intensity is lower than that of the quantum well structure 600 by about two digits, and the FWHM of the PL emission peak is wider than that of the quantum well structure 600.

In the second example, before growing the $Al_{0.1}Ga_{0.9}As_{0.98}N_{0.02}$ well layer 603 on the $Al_{0.5}Ga_{0.5}As$ lower barrier layer 601 formed in step A6, a surface of the $Al_{0.5}Ga_{0.5}As$ lower barrier layer 601 is covered with the $Al_{0.1}Ga_{0.9}As$ intermediate layer 602 in step B6a. Then, $NH_3$ as a nitrogen source is added in step B6b to form the $Al_{0.1}Ga_{0.9}As_{0.98}N_{0.02}$ well layer 603. The $Al_{0.1}Ga_{0.9}As$ intermediate layer 602 has a thickness corresponding to one molecule.

In step B6a, the surface of the $Al_{0.5}Ga_{0.5}As$ lower barrier layer 601 having an Al composition ratio of as high as 0.5 is covered with the $Al_{0.1}Ga_{0.9}As$ intermediate layer 602 having an equivalent group III composition to that of the $Al_{0.1}Ga_{0.9}As_{0.98}N_{0.02}$ well layer 603 which is to be grown. By this process, the decomposition and adsorption efficiency of the nitrogen source at the initial growth stage (when the supply of nitrogen source is started) becomes approximately the same as that at a later stage of the growth of the well layer 603. Accordingly, the nitrogen concentration is uniformized from the vicinity of the interface between the $Al_{0.1}Ga_{0.9}As_{0.98}N_{0.02}$ well layer 603 and the $Al_{0.1}Ga_{0.9}As$ intermediate layer 602 to a central region of the $Al_{0.1}Ga_{0.9}As_{0.98}N_{0.02}$ well layer 603. Although the $Al_{0.1}Ga_{0.9}As_{0.98}N_{0.02}$ well layer 603 and the $Al_{0.1}Ga_{0.9}As$ intermediate layer 602 have different group V compositions from each other, the nitrogen composition ratio of the $Al_{0.1}Ga_{0.9}As_{0.98}N_{0.02}$ well layer 602 is about 2% at most, and thus the influence of nitrogen is relatively small. Accordingly, the growth of the $Al_{0.1}Ga_{0.9}As_{0.98}N_{0.02}$ well layer 603 proceeds at the decomposition and adsorption efficiency of the nitrogen source which is determined by the group III composition ratios of the $Al_{0.1}Ga_{0.9}As_{0.98}N_{0.02}$ well layer 603, the layer below the $Al_{0.1}Ga_{0.9}As_{0.98}N_{0.02}$ well layer 603, and the interface therebetween (in the case of the second example, the Al composition ratio). Thus, sharp PL emission having a narrow FWHM is observed between quantum levels of the quantum well structure 600.

In this example, after the AlGaNAs well layer 603 is grown, the AlGaAs upper barrier layer 605 is grown.

As a result of studies performed by the present inventors, it has been found that even when supply of $NH_3$ as a nitrogen source is stopped after the AlGaNAs well layer 603 is formed, $NH_3$ is not immediately extinct from the growth chamber and remains in the growth chamber for awhile. When the growth is paused after the AlGaNAs well layer is grown as in conventional example 2 or comparative example 1 in such a state, the surface of the AlGaNAs well layer having a high reactivity with the nitrogen source is nitrided, as a result of which, a high concentration of nitrogen is adsorbed onto the surface. When the upper barrier layer is grown on the well layer in this state, the high concentration of nitrogen remains at the hetero-junction of the well layer and the upper barrier layer. Therefore, non-light emission centers are generated, which deteriorates the light emission characteristics.

In this example, after the well layer 603 is grown, the next layer is grown continuously, i.e., with no growth pause. Accordingly, the above-described problem does not occurs and thus a satisfactory hetero-junction can be formed. In addition, in the second example, the optimum supply amount of $As_4$ for the well layer 603 is different from that for the AlGaAs upper barrier layer 605. By forming the intermediate layer 604 therebetween and adjusting the supply amount of $As_4$ during the growth of the intermediate layer 604, the optimum supply amount can be set independently for the well layer 603 and for the upper barrier layer 605.

Figure 5B:
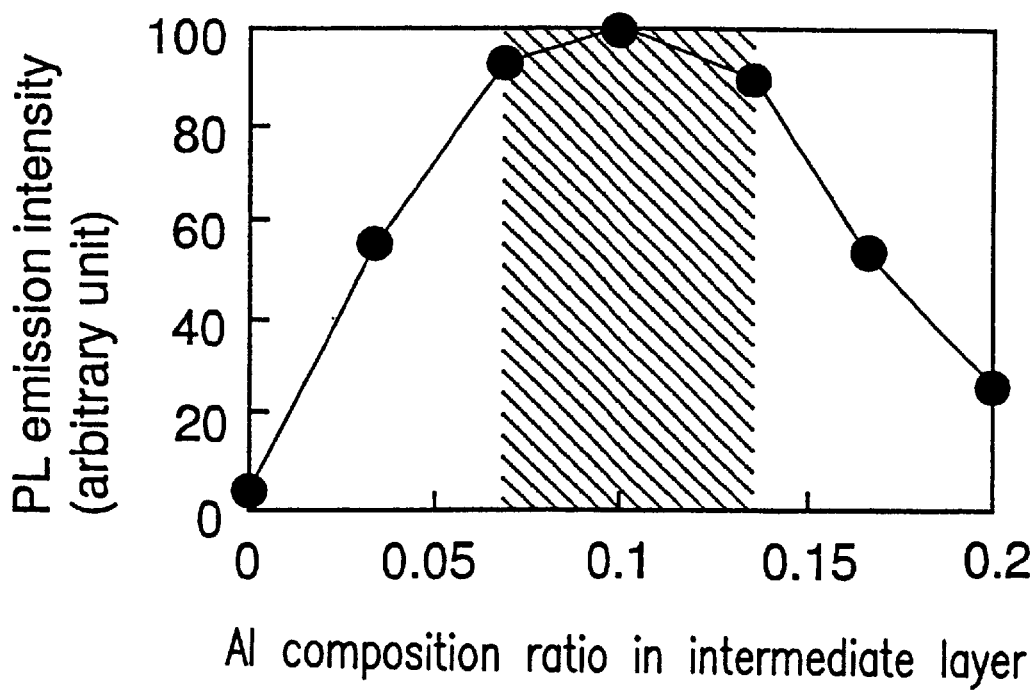
FIG. 5B is a graph illustrating the correlation between the Al composition ratio of the intermediate layer and the PL emission intensity of the quantum well structure in a second example of the present invention.

In the second example, before growing the $Al_{0.1}Ga_{0.9}As_{0.98}N_{0.02}$ well layer 602 on the $Al_{0.5}Ga_{0.5}As$ lower barrier layer 601, the $Al_{0.1}Ga_{0.9}As$ intermediate layer 602 having the same Al composition ratio as that of the $Al_{0.1}Ga_{0.9}As_{0.98}N_{0.02}$ well layer 603 is formed on the lower barrier layer 601. The Al composition ratio of the GaInAs intermediate layer 602 does not need to completely match the Al composition ratio of the AlGaNAs well layer 603 to be formed thereon. FIG. 5B shows the correlation between the Al composition ratio of the intermediate layer 602 and the PL emission intensity of the quantum well structure. Here, the Al composition ratio of the well layer 603 is 0.1. The PL emission intensity of the quantum well structure is maximum when the Al composition ratio of the intermediate layer 602 is exactly the same as that of the well layer 603 grown thereon (i.e., 0.1), As long as the Al composition ratio is within the range of 0.07 to 0.13, the reduction in the PL emission intensity is only by 10% at most. It is appreciated from these results that the Al composition ratio of the intermediate layer 602 is in the range of −30% to +30% of the Al composition ratio of the well layer 603. The range from −30% to +30% is smaller than the range from −50% to +50% for the case of the In composition ratio in the first example. The reason is considered to be that Al has a larger influence on the reactivity with the nitrogen source than In.

EXAMPLE 3

According to a third example of the present invention a single quantum well structure including an AlGaAs barrier layer and a GaAsSbN well layer is grown an a GaAs substrate. In the first and second examples, the group V composition of the well layer includes only N and As; whereas in the third example, the group V composition of the well layer includes N, As and Sb.

Figure 7A:
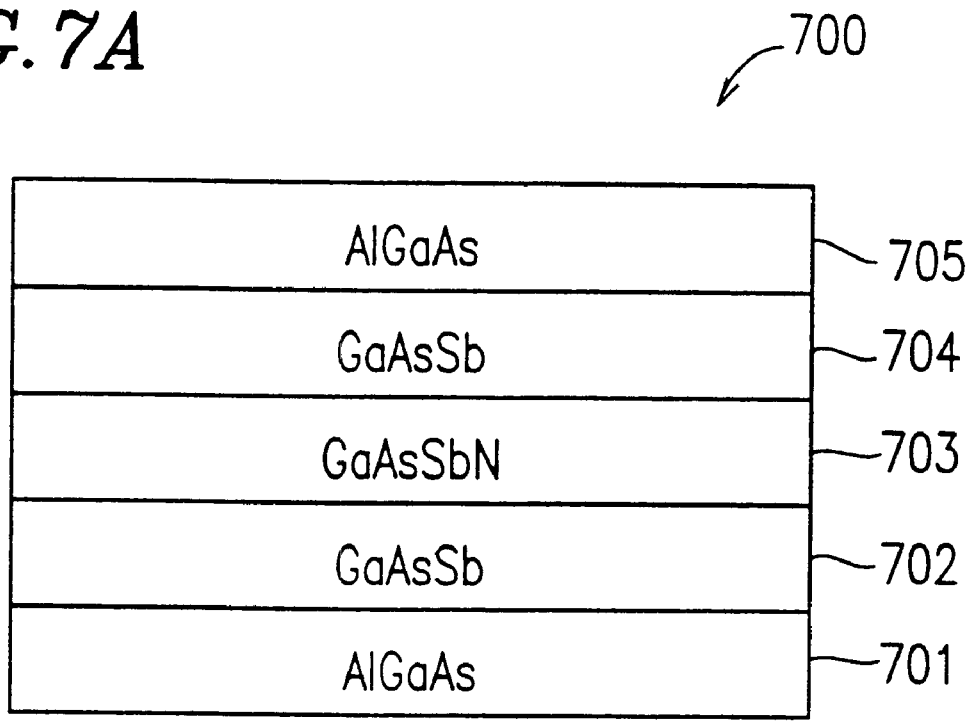
FIG. 7A is a schematic view illustrating a quantum well structure according to a third example of the present invention.

FIG. 7A shows a structure of a single quantum well structure 700 in the third example. The quantum well structure 700 includes an $Al_{0.3}Ga_{0.7}As$ lower barrier layer 701, a GaAsSb intermediate layer 702, a $Ga(As_{0.9}Sb_{0.1})_{0.97}N_{0.03}$ well layer 703, a GaAsSb intermediate layer 704, and an $Al_{0.3}Ga_{0.7}As$ upper barrier layer 705.

The single quantum well structure 700 is grown on a GaAs (100) substrate (not shown) by gas source MBE, using metal Ga, metal Al, metal Sb, metal As ($As_2$) and MMeHy (monomethylhydrazine) as sources of Ga, Al, Sb, As and N, respectively. Only MMeHy is a gas source. The temperature of the GaAs substrate during the growth is set to be 450° C.

Figure 7B:
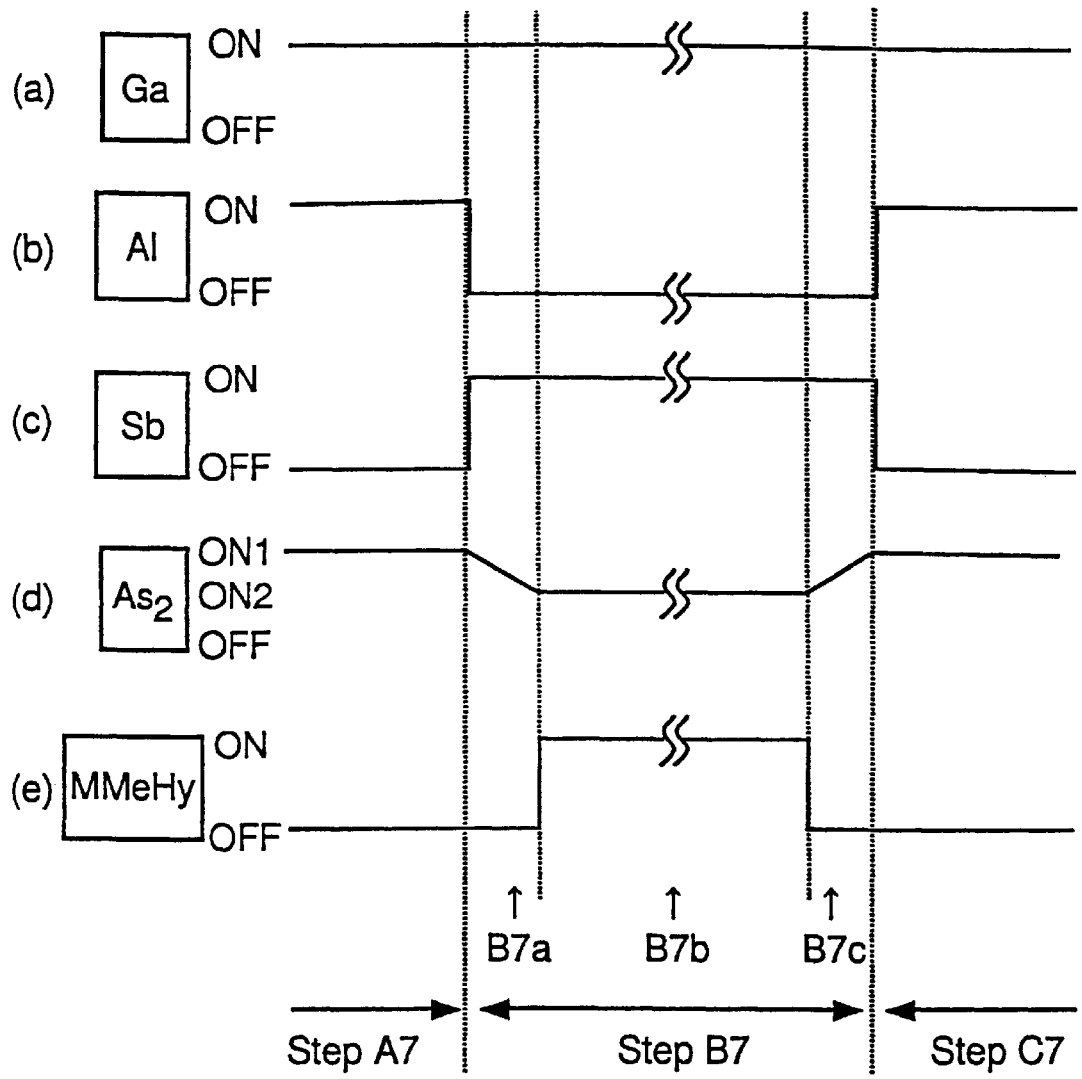
FIG. 7B is a diagram illustrating supply sequences of sources for forming the quantum well structure shown in FIG. 7A.

FIG. 7B shows supply sequences of sources for forming the quantum well structure 700. In FIG. 7B, parts (a) through (s) show the supply sequences of the respective sources. The quantum well structure 700 is produced by steps A7, B7 and C7.

In step A7, the $Al_{0.3}Ga_{0.7}As$ lower barrier layer 701 is grown to about 0.2 μm. At this point, the beam equivalent pressures of Al, Ga and $As_2$ are respectively set to be $7.8\times10^{-8}$ torr, $2.9\times10^{-7}$ torr, and $1.5\times10^{-5}$ torr. The growth time period is set to be 20 minutes.

Step B7 includes three steps of B7a, B7b and B7c. In step B37a, Ga, As and Sb beams are supplied for about 10 seconds continuously, i.e., with no growth pause, after the growth of the lower barrier layer 701 in step A7. Thus, the GasSb intermediate layer 702 is formed. Continuously, in step B7b, an MMeHy beam as a nitrogen source is added for about 55 seconds, thereby forming the $Ga(As_{0.9}Sb_{0.1})_{0.97}N_{0.03}$ well layer 703 to a thickness of about 7 nm. Continuously, in step B7c, Ga, As and Sb beams are supplied for about 10 seconds, thereby forming the GaAsSb intermediate layer 704. Thus, step B7 is completed. The beam equivalent pressures of Ga, $As_2$, Sb and MMeHy in step B7b are respectively set to be $2.9\times10^{-7}$ torr, $6.8\times10^{-6}$ torr, $7.5\times10^{-7}$ torr, and $5.0\times10^{-6}$ torr. The supply amount of the $As_2$ beam is different among steps A7, C7 and B1b. In step B7a between steps A7 and B7b and in step B7c between steps B7b and C7, the supply amount of the $As_2$ beam is changed with no growth pause. $As_2$ is supplied using a source cell with a valve, and thus the supply amount of $As_2$ is gradually changed during the 10 seconds of step B7a.

In step C7, the $Al_{0.3}Ga_{0.7}As$ upper barrier layer 705 is formed to a thickness of about 0.2 μm continuously, i.e., without no growth pause, after step B7. At this point, the beam equivalent pressures of Al, Ga and $As_2$ are respectively set to be $7.8\times10^{-8}$ torr, $2.9\times10^{-7}$ torr, and $1.5\times10^{-5}$ torr. The growth time period is set to be 20 minutes.

It is observed that at room temperature, the single quantum well structure 700 thus produced performs PL emission having a wavelength of 1.55 μm. The PL emission intensity at this point is sufficiently high, and the FWHM of the PL emission peak is as narrow as 24 meV. As can be appreciated from these numerical values, the PL emission is sufficiently sharp.

For comparison, a quantum well structure including an AlGaAs barrier layer and a GaAsSbN well layer which directly contact each other is produced, and the PL emission characteristics of the comparative quantum well structure are measured. The PL emission intensity is lower than that of the quantum well structure 700 by about two digits, and the FWHM of the PL emission peak is wider than that of the quantum well structure 700.

In the third example, before growing the $Ga(As_{0.9}Sb_{0.1})_{0.97}N_{0.03}$ well layer 703 on the $Al_{0.3}Ga_{0.7}As$ lower barrier layer 701 formed in step A7, a surface of the $Al_{0.9}Ga_{0.7}As$ lower barrier layer 701 is covered with the GaAsSb intermediate layer 702 in step B7a. Then, MMeHy as a nitrogen source is added in step B7b to form the $Ga(As_{0.9}Sb_{0.1})_{0.97}N_{0.03}$ well layer 703. The GaAsSb intermediate layer 702 has a thickness corresponding to five molecules.

In step B7a, the surface of the $Al_{0.3}Ga_{0.7}As$ lower barrier layer 701 having a high Al composition ratio and thus having a significantly high reactivity with the nitrogen source is covered with the GaAsSb intermediate layer 702 having a group III composition and a group V composition substantially equal to those of the $Ga(As_{0.9}Sb_{0.1})_{0.97}N_{0.03}$ well layer 703 which is to be grown. By this process, the decomposition and adsorption efficiency of the nitrogen source at the initial growth stage (when the supply of nitrogen source is started to form the well layer 703) becomes approximately the same as that at a later stage of the growth of the well layer 703. Accordingly, the nitrogen concentration is uniformized from the vicinity of the interface between the $Ga(As_{0.9}Sb_{0.1})_{0.97}N_{0.03}$ well layer 703 and the GaAsSb intermediate layer 702 to a central region of the $Ga(As_{0.9}Sb_{0.1})_{0.97}N_{0.03}$ well layer 703. Thus, sharp PL emission having a narrow FWHM is observed between quantum levels of the quantum well structure 700.

In step B7a, the supply amount of $As_2$ is gradually decreased during 10 seconds. Accordingly, the Sb composition ratio in the group V composition of the intermediate layer 702 is relatively low at the beginning of step B7a but increases to be equivalent to the Sb composition ratio of the well layer 703 at the end of step B7a. Due to such a process, the Sb composition ratio in the group V composition of the intermediate layer 702 change in a grading manner. Even in such a case, the effect of the present invention is provided as long as the composition ratios of the elements at the uppermost surface of the intermediate layer 702 are sufficiently close to those of the well layer 703.

EXAMPLE 4

According to a fourth example of the present invention, a single quantum well structure including a GaInP barrier and an AlGaAsN well layer is grown on a GaAs substrate. In the first through third examples, the barrier layers include aluminum, and thus have a high reactivity with the nitrogen source, and the well layer formed thereon includes nitrogen mixed in a composition having a relatively low reactivity with the nitrogen source. In the fourth example, the barrier layers include indium, and thus have a low reactivity with the nitrogen source, and the well layer including nitrogen also includes aluminum, and thus has a high reactivity with the nitrogen source.

Figure 8A:
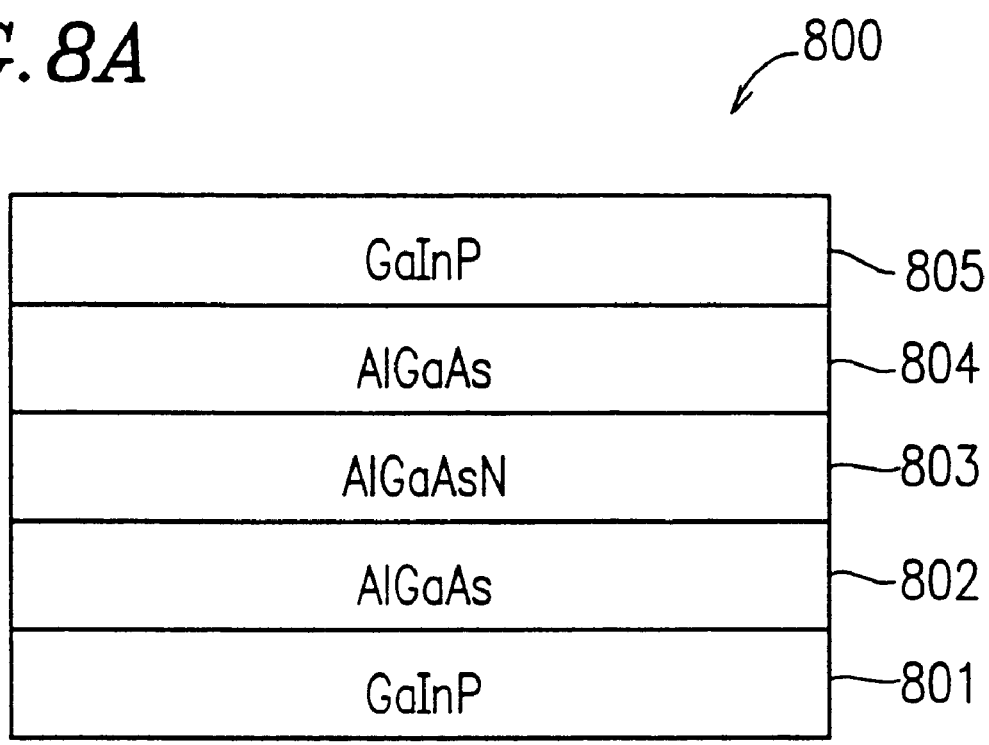
FIG. 8A is a schematic view illustrating a quantum well structure according to a fourth example of the present invention.

FIG. 8A shows a structure of a single quantum well structure 800 in the fourth example. The quantum well structure 800 includes a $Ga_{0.5}In_{0.5}P$ lower barrier layer 801, an AlGaAs intermediate layer 802, an $Al_{0.05}Ga_{0.95}As_{0.95}N_{0.05}$ well layer 803 an AlGaAs intermediate layer 804, and a $Ga_{0.5}In_{0.5}P$ upper barrier layer 805.

The single quantum well structure 800 is grown on a GaAs (100) ([011] orientation 15° off) substrate (not shown) by MOCVD, using TMGa (trimethyl gallium), TMAl (trimethyl aluminum), TMIn (trimethyl indium), $AsH_3$ (arsine), $PH_3$ (phosphine), and $NH_3$ (ammonia) as sources of Ga, Al, In, As, P and N, respectively. As a carrier gas, $H_2$ (hydrogen) is used. The temperature of the GaAs substrate during the growth is set to be 580° C.

Figure 8B:
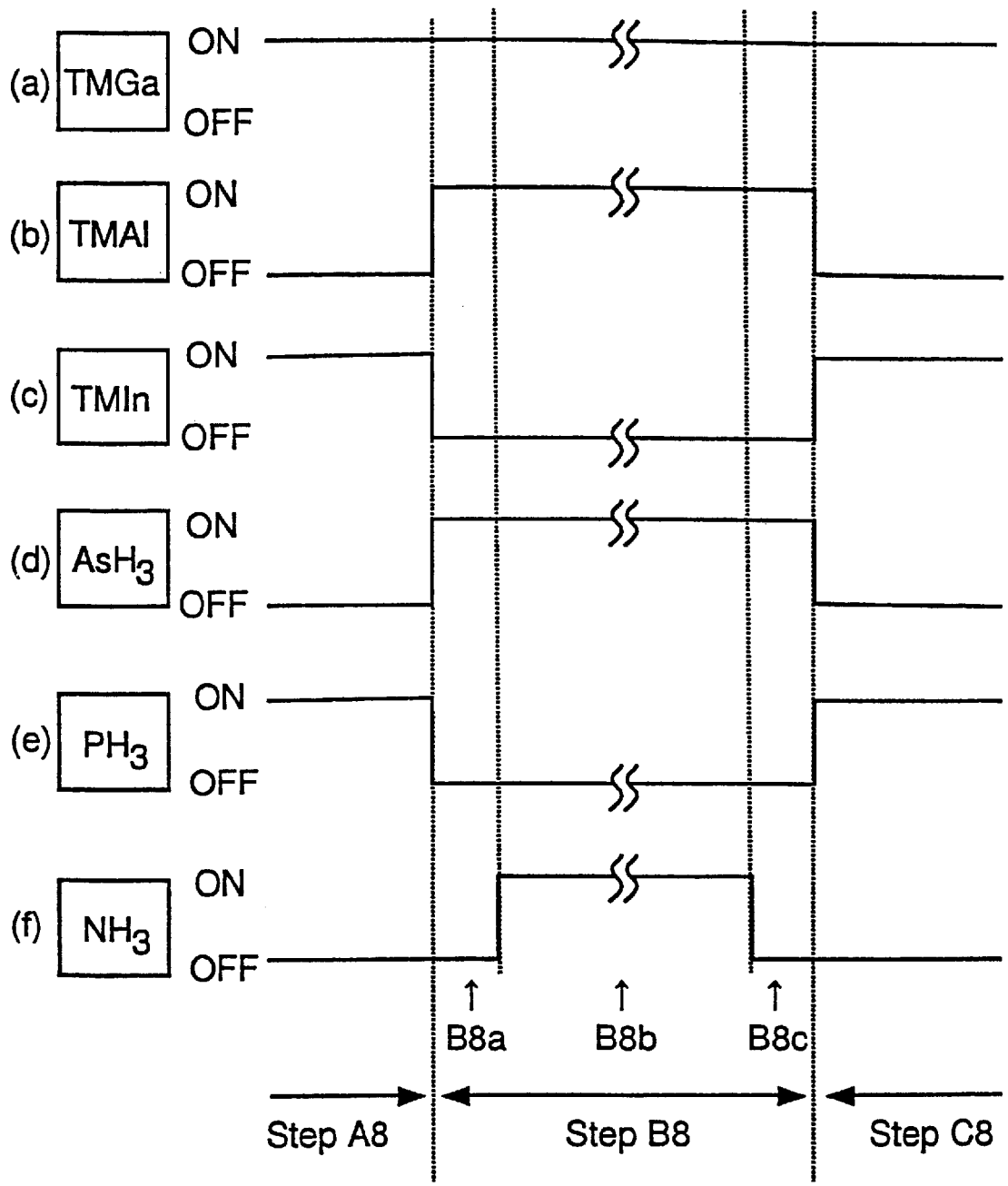
FIG. 8B is a diagram illustrating supply sequences of sources for forming the quantum well structure shown in FIG. 8A.

FIG. 8B shows supply sequences of sources for forming the quantum well structure 800. In FIG. 8B, parts (a) through (f) show the supply sequences of the respective sources. The quantum well structure 800 is produced by steps A8, B8 and C8.

In step A8, the $Ga_{0.5}In_{0.5}P$ lower barrier layer 801 is grown to about 0.2 $\mu$m. At this point, the supply amounts of TMGa, TMIn, $PH_3$ are respectively set to be 2.0 sccm, 2.5 sccm and 200 sccm. The growth time period is set to be 15 minutes.

Step B8 includes three steps of B8a, B8b and B8c. In step B8a, TMGA, TMAl and $AsH_3$ are supplied for about 4 seconds continuously, i.e., with no growth pause, after the growth of the lower barrier layer 801 in step A8. Thus, the AlGaAs intermediate layer 802 is formed. Continuously, in step B8b, $NH_3$ as a nitrogen source is added for about 60 seconds, thereby forming the $Al_{0.05}Ga_{0.95}As_{0.95}N_{0.05}$ well layer 803 to a thickness of about 7.5 mm. Continuously, in step B8c, TMGa, TMAl and $AsH_3$ are supplied for about 4 seconds, thereby forming the AlGaAs intermediate layer 804. Thus, step B8 is completed. The supply amounts of TMGa, TMAl, $AsH_3$ and $NH_3$ in step B8b are respectively set to be 2.0 sccm, 0.1 sccm, 150 sccm and 50 sccm.

In step C8, the $Ga_{0.5}In_{0.5}P$ upper barrier layer 805 is formed to a thickness of about 2 $\mu$m continuously, i.e., without no growth pause, after step B8. At this point, the supply amounts of TMGa, TMIn and $PH_3$ are set to be 2.0 sccm, 2.5 sccm and 200 sccm, respectively. The growth time period is set to be 15 minutes.

It is observed that at room temperature, the single quantum well structure 800 thus produced performs PL emission having a wavelength of 1.6 $\mu$m. The PL emission intensity at this point is sufficiently high, and the FWHM of the PL emission peak is as narrow as 29 meV. As can be appreciated from these numerical values, the PL emission Is sufficiently sharp.

For comparison, a quantum well structure including a GaInP barrier layer and an AlGaNAs well layer which directly contact each other is produced, and the PL emission characteristics of the comparative quantum well structure are measured. The PL emission intensity is lower than that of the quantum well structure 800 by about two digits, and the FWHM of the PL emission peak is wider than that of the quantum well structure 800.

In the fourth example, before growing the $Al_{0.5}Ga_{0.95}As_{0.95}N_{0.05}$ well layer 803 on the $Ga_{0.45}In_{0.05}P$ lower barrier layer 601 formed in step A8, a surface of the $Ga_{0.05}In_{0.05}P$ lower barrier layer 801 is covered with the AlGaAs intermediate layer 802 in step B8a. Then, $NH_3$ as a nitrogen source is added in step B8b to form the $Al_{0.05}Ga_{0.95}As_{0.95}N_{0.05}$ well layer 803. The AlGaAs intermediate layer 802 has a thickness corresponding to two molecules.

In step B8a, the surface of the $Ga_{0.5}In_{0.5}P$ lower barrier layer 801 having a high In composition ratio and thus having a significantly low reactivity with the nitrogen source is covered with the AlGaAs intermediate layer 802 having group III composition ratios substantially equal to those of than $Al_{0.05}Ga_{0.95}As_{0.95}N_{0.05}$ well layer 803 which is to be grown. By this process, the decomposition and adsorption efficiency of the nitrogen source at the initial growth stage (when the supply of nitrogen source is started to form the well layer 803) becomes approximately the same as that at a later stage of the growth of the well layer 803. Accordingly, the nitrogen concentration is uniformized from the vicinity of the interface between the $Al_{0.05}Ga_{0.95}As_{0.95}N_{0.05}$ well layer 803 and the AlGaAs intermediate layer 802 to a central region of the $Al_{0.05}Ga_{0.95}As_{0.95}N_{0.05}$ well layer 803. Thus, sharp PL emission having a narrow FWHM is observed between quantum levels of the quantum well structure 800.

The present inventors have confirmed that the effect of the present invention is provided in a quantum well structure including an InP lower barrier layer and a $Ga_{0.5}In_{0.5}As_{0.97}N_{0.02}$ well layer grown on an InP substrate, and also a quantum well structure in which a lower barrier layer and a layer grown thereon (including nitrogen) both include In but the reactivity with the nitrogen source is low since the In composition ratio in the lower barrier layer is high.

In this example, after the AlGaNAs well layer 803 is grown, the GaInP upper barrier layer 805 is grown.

As a result of studies performed by the present inventors, it has been found that even when supply of $NH_3$ as a nitrogen source is stopped after the AlGaNAs well layer 803 is formed, $NH_3$ is not immediately extinct from the growth chamber and remains in the growth chamber for a while. When the growth is paused after the AlGaNAs well layer is grown as in conventional example 2 or comparative example 1 in such a state, the surface of the AlGaNAs well layer having a high reactivity with the nitrogen source is nitrided, as a result of which, a high concentration of nitrogen is adsorbed onto the surface. When the upper barrier layer is grown on the well layer in this state the high concentration of nitrogen remains at the hetero-junction or the well layer and the upper barrier layer. Therefore, non-light emission centers are generated, which deteriorates the light emission characteristics.

In this example, after the well layer 803 is grown, the next layer is grown continuously, i.e., with no growth pause. Accordingly, the above-described problem does not occur, and thus a satisfactory hetero-interface can be formed.

As in the second example, it has been confirmed that the Al composition ratio of the intermediate layer 802 can be changed in the range of ±30% of the Al composition ratio of the well layer 803.

EXAMPLE 5

According to a fifth example of the present invention, a single quantum well structure including an AlGaInP barrier layer and an AlGaInPN well layer is grown on a GaAs substrate. In the first through fourth examples, the lower barrier layer or the well layer grown thereon (including nitrogen) includes either In or Al. In the fifth example, at least one of the lower barrier layer and the well layer includes both In and Al as a group III composition.

Figure 9A:
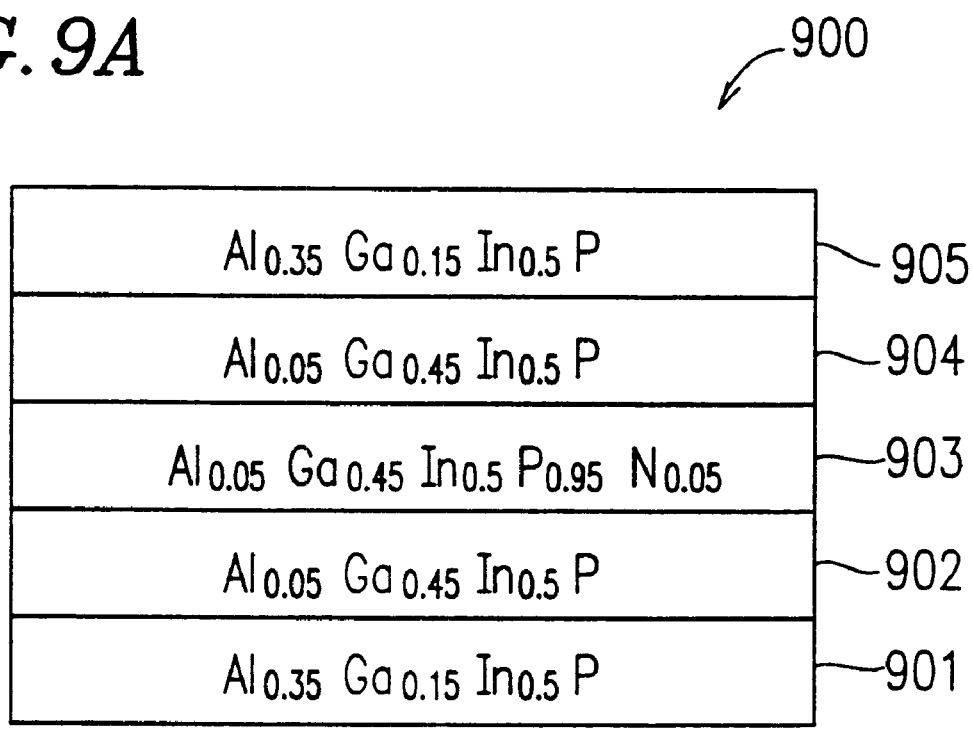
FIG. 9A is a schematic view illustrating a quantum well structure according to a fifth example of the present invention.

FIG. 9A shows a structure of a single quantum well structure 900 in the fifth example. The quantum well structures 900 includes an $Al_{0.35}Ga_{0.15}In_{0.5}P$ lower barrier layer 901, an $Al_{0.05}Ga_{0.45}In_{0.5}P$ intermediate layer 902, an $Al_{0.05}Ga_{0.45}In_{0.5}P_{0.95}N_{0.05}$ well layer 903, an $Al_{0.05}Ga_{0.45}In_{0.5}P$ intermediate layer 904, and an $Al_{0.35}Ga_{0.15}In_{0.6}P$ upper barrier layer 905.

The single quantum well structure 900 is grown on a GaAs (100) ([0–11] orientation 10° off) substrate (not shown) by MOCVD, using TMGa, TMAl, TMIn, $PH_3$, and $N_2H_4$ (hydrazine) as sources of Ga, Al, In, P and N, respectively. As a carrier gas, a mixture gas of $H_2$ and $N_2$ (nitrogen) is used. The temperature of the GaAs substrate during the growth is set to be 550° C.

Figure 9B:
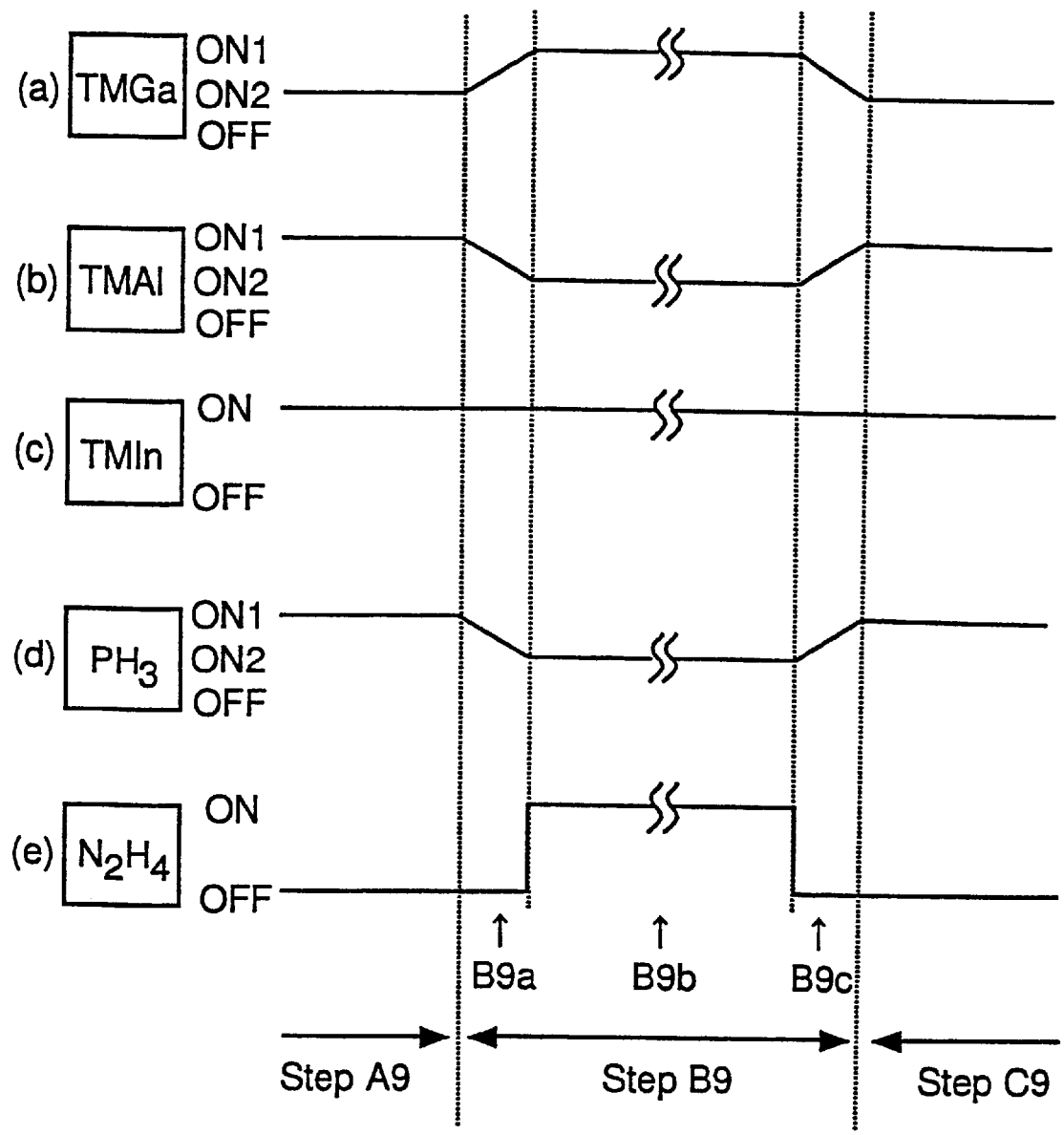
FIG. 9B is a diagram illustrating supply sequences of sources for forming the quantum well structure shown in FIG. 9A.

FIG. 9B shows supply sequences of sources for forming the quantum well structure 900. In FIG. 9B, parts (a) through (e) show the supply sequences of the respective sources. The quantum well structure 900 is produced by steps A9, B9 and C9.

In step A9, the $Al_{0.35}Ga_{0.15}In_{0.5}P$ lower barrier layer 901 is grown to about 0.2 µm. At this point, the supply amounts of TMGa, TMAl, TMIn, and $PH_3$ are respectively set to be 0.5 sccm, 1.2 sccm, 1.8 sccm and 50 sccm. The growth time period is set to be 15 minutes.

Step B9 includes three steps of B9a, B9b and B9c. In step B9a, TMGa, TMAl, TMIn and $PH_3$ are supplied for about 10 seconds continuously, i.e., with no growth pause, after the growth of the lower barrier layer 901 in step A9. Thus, the $Al_{0.05}Ga_{0.45}In_{0.5}P$ intermediate layer 902 is formed. Continuously, in step B9b, $N_2H_4$ as a nitrogen source is added for about 90 seconds, thereby forming the $Al_{0.05}Ga_{0.45}In_{0.5}P_{0.95}N_{0.05}$ well layer 903 to a thickness of about 10 nm. Continuously, in step B9c, TMGa, TMAl, TMIn and $PH_3$ are supplied for about 10 seconds, thereby forming the $Al_{0.05}Ga_{0.45}In_{0.5}P$ intermediate layer 904. Thus, step B9 is completed. The supply amounts of TMGa, TMAl, TMIn, $PH_3$ and $N_2H_4$ in step B9b are respectively set to be 1.5 sccm, 0.2 sccm, 1.8 sccm and 50 sccm.

In step C9, the $Al_{0.35}Ga_{0.15}In_{0.5}P$ upper barrier layer 905 is formed to a thickness of about 0.2 µm continuously, i.e., without no growth pause, after step B9. At this point, the supply amounts of TMGa, TMAl, TMIn and $PH_3$ are set to be 0.5 sccm, 1.2 sccm, 1.8 sccm and 50 sccm, respectively. The growth time period is set to be 15 minutes.

It is observed that at room temperature, the single quantum well structure 900 thus produced performs PL emission having a wavelength of 1.0 µm. The PL emission intensity at this point is sufficiently high, and the FWHM of the PL emission peak is as narrow as 25 meV. As can be appreciated from these numerical values, the PL emission is sufficiently sharp.

For comparison, a quantum well structure including an $Al_{0.35}Ga_{0.15}In_{0.5}P$ barrier layer and an $Al_{0.05}Ga_{0.45}In_{0.5}P_{0.95}N_{0.05}$ well layer which directly contact each other is produced, and the PL emission characteristics of the comparative quantum well structure are measured. The PL emission intensity is lower than that of the quantum well structure 900 by about two digits, and the FWHM of the PL emission peak is wider than that of the quantum well structure 900.

In the fifth example, before growing the $Al_{0.05}Ga_{0.45}In_{0.5}P_{0.95}N_{0.05}$ well layer 903 on the $Al_{0.35}Ga_{0.15}In_{0.5}P$ lower barrier layer 901 formed in step A9, a surface of the $Al_{0.35}Ga_{0.15}In_{0.5}P$ lower barrier layer 901 is covered with the $Al_{0.05}Ga_{0.45}In_{0.5}P$ intermediate layer 902. Then, $N_2H_4$ as a nitrogen source is added in step B9b to form the $Al_{0.05}Ga_{0.45}In_{0.5}P_{0.95}N_{0.05}$ well layer 903. The $Al_{0.05}Ga_{0.45}In_{0.5}P$ intermediate layer 902 has a thickness corresponding to five molecules.

In step B9a, the surface of the $Al_{0.35}Ga_{0.15}In_{0.5}P$ lower barrier layer 901 is covered with the $Al_{0.05}Ga_{0.45}In_{0.5}P$ intermediate layer 902 having group III composition ratios substantially equal to those of the $Al_{0.05}Ga_{0.45}In_{0.5}P_{0.95}N_{0.05}$ well layer 903 which is to be grown. By this process, even in this example in which the degree of reactivity of the lower barrier layer 901 with nitrogen is not clear since the lower barrier layer 901 includes both Al and In, the decomposition and adsorption efficiency of the nitrogen source at the initial growth stage (when the supply of nitrogen source is started to form the well layer 903) becomes approximately the same as that at a later stage of the growth of the well layer 903. Accordingly, the nitrogen concentration is uniformized from the vicinity of the interface between the $Al_{0.05}Ga_{0.45}In_{0.5}P_{0.95}N_{0.05}$ well layer 903 and the $Al_{0.05}Ga_{0.45}In_{0.5}P$ intermediate layer 902 to a central region of the $Al_{0.05}Ga_{0.45}In_{0.5}P_{0.95}N_{0.05}$ well layer 903. Thus, sharp PL emission having a narrow FWHM is observed between quantum levels of the quantum well structure 900.

The reactivity, with the nitrogen source, of the layers including both Al and In is determined based on the balance of the Al composition ratio and the In composition ratio. As a result of an experiment performed by the present inventors, $Al_{0.35}Ga_{0.15}In_{0.5}P$ used for the barrier layer 901 has a relatively high reactivity with nitrogen source, and $Al_{0.05}Ga_{0.45}In_{0.5}P_{0.95}N_{0.05}$ used for the well layer 903 has a relatively low reactivity with the nitrogen source.

The present inventors have found that the effects of the present invention are provided when either one of a layer to be grown (including nitrogen) or a layer below this layer includes both An and In (for example, in a quantum well structure, including an $Al_{0.3}Ga_{0.7}As$ barrier layer and an $Al_{0.1}Ga_{0.6}In_{0.3}N_{0.02}As_{0.98}$ well layer, which is grown on a GaAs substrate).

In this example, after the AlGaInPN well layer 903 is grown, the AlGaInP upper barrier layer 905 is grown.

Even when supply of $N_2H_4$ as a nitrogen source is stopped after the AlGaInPN well layer 903 is formed, $N_2H_4$ is not immediately extinct from the growth chamber and remains in the growth chamber for a while. When the growth is paused after the AlGaInPN well layer is grown as in conventional example 2 or comparative example 1 in such a state, the surface of the AlGaInPN well layer having a high reactivity with the nitrogen source is nitrided, as a result of which, a high concentration of nitrogen is adsorbed onto the surface. When the upper barrier layer is grown on the well layer in this state, the high concentration of nitrogen remains at the hetero-junction of the well layer and the upper barrier layer. Therefore, non-light emission centers are generated, which deteriorates the light emission characteristics.

In this example, after the well layer 903 is grown, the next layer is grown continuously, i.e., with no growth pause. Accordingly, the above-described problem does not occur, and thus a satisfactory hetero-junction can be formed.

The optimum supply amount of $PH_3$ for the AlGaInP well layer 903 is different from that for the AlGaInP upper barrier layer 905. By providing the intermediate layer 904 between the AlGaInPN well layer 903 and the AlGaInP upper barrier layer 905 and adjusting the supply amount of $PH_3$ during the growth of the intermediate layer 904, the optimum supply amount of $PH_3$ can be set independently for the well layer 903 and for the upper barrier layer 905.

In stop B9a, the supply amount of TMAl is gradually decreased and the supply amount of TMGa is gradually increased during 10 seconds. Accordingly, the Al composition ratio in the group III composition in the intermediate layer 902 is 0.35 but decreases to 0.05, which is equivalent to the Al composition ratio in the well layer 903 at the end of step B9a. Due to such a process, the composition ratios of the elements in the intermediate layer 902 changes in a grading manner. Even in such a case, the effect of the present invention is provided as long as the composition ratios of the elements at the uppermost surface of the intermediate layer 902 are sufficiently close to those of the well layer 903.

The Al composition ratio of the intermediate layer 902 can be changed in the range of ±30% of the Al composition ratio of the well layer 903. The In composition ratio of the intermediate layer 902 can be changed in the range of ±50% of the In composition ratio of the well layer 903.

EXAMPLE 6

According to a sixth example of the present invention, a single quantum well structure including an AlGaInNAs barrier layer and a GaInNAs well layer is grown on a GaAs substrate. In the first through fifth examples, the lower barrier layer does not include nitrogen, and the well layer grown thereon includes nitrogen. In the sixth example, both the lower barrier layer and the well layer include nitrogen.

Figure 9C:
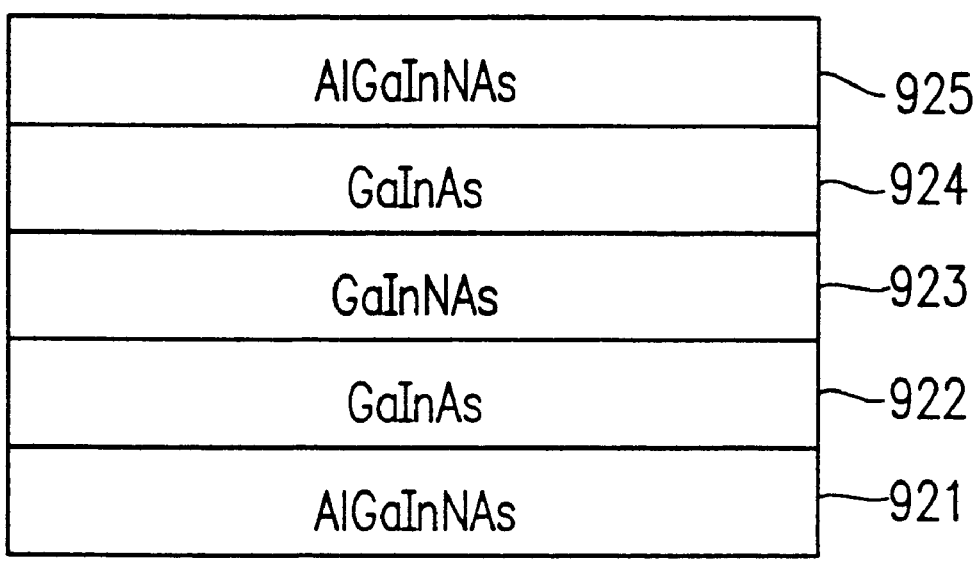
FIG. 9C is a schematic view illustrating a quantum well structure according to a sixth example of the present invention.

FIG. 9C shows a structure of a single quantum well structure 920 in the sixth example. The quantum well structure 920 formed on a GaAs (100) substrate includes an $(Al_{0.5}Ga_{0.5})_{0.93}In_{0.07}N_{0.025}As_{0.975}$ lower barrier layer 921 (thickness: 0.2 µm), a $Ga_{0.93}In_{0.07}As$ intermediate layer 922 (thickness: 1.5 nm), a $Ga_{0.93}In_{0.07}N_{0.025}As_{0.975}$ well layer 923 (thickness: 6 nm), a $Ga_{0.93}In_{0.07}As$ intermediate layer 924 (thickness: 1.5 nm), and an $(Al_{0.5}Ga_{0.5})_{0.99}In_{0.07}N_{0.025}As_{0.975}$ upper barrier layer 925 (thickness: 0.2 µm).

The single quantum well structure 920 is grown by gas source MBE, using metal Ga, metal In, metal Al, TBAs (tertiary butyl arsenic) and DMeHy as sources of Ga, In, Al, As and N, respectively. TBAs and DMeHy are gas sources. The temperature of the GaAs substrate during the growth is set to be 550° C.

Figure 9D:
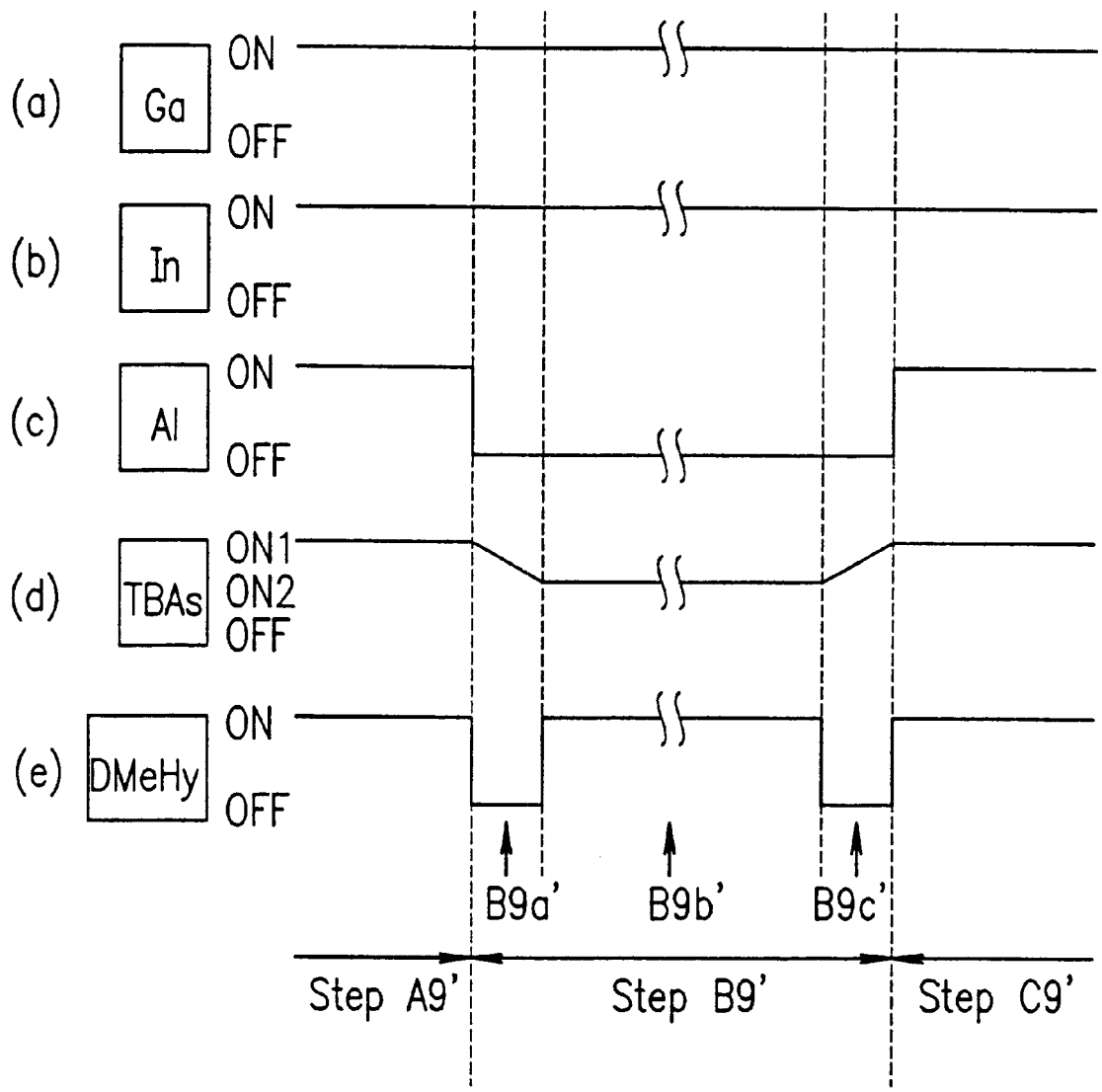
FIG. 9D is a diagram illustrating supply sequences of sources for forming the quantum well structure shown in FIG. 9C.

FIG. 9D shows supply sequences of sources for forming the quantum well structure 920. In FIG. 9D, parts (a) through (e) show the supply sequences of the respective sources. The quantum well structure 920 is produced by steps A9', B9' and C9'. The growth of the quantum well structure 920 is performed continuously, i.e., with no growth pause, like in the first through fifth examples.

In step A9', the $(Al_{0.5}Ga_{0.5})_{0.93}In_{0.07}N_{0.025}As_{0.975}$ lower barrier layer 921 is grown.

Step B9' includes three steps of B9a', B9b' and B9c'. In step B9a', Ga, In and TBAs are supplied continuously, i.e., with no growth pause, after the growth of the lower barrier layer 921 in step A9'. Thus, the $Ga_{0.93}In_{0.07}As$ intermediate layer 922 is formed. Continuously, in step B9b', DMeHy as a nitrogen source is added, thereby forming the $Ga_{0.93}In_{0.07}N_{0.025}As_{0.975}$ well layer 923. Continuously, in step B9a', Ga, In and TBAs are supplied, thereby forming the $Ga_{0.93}In_{0.07}As$ intermediate layer 924. Thus, step B9' is completed.

In step C9', the $(Al_{0.5}Ga_{0.5})_{0.93}In_{0.07}N_{0.025}As_{0.975}$ upper barrier layer 925 is formed continuously, i.e., without no growth pause, after step B9'.

It is observed that at room temperature, the single quantum well structure 920 thus produced performs PL emission having a wavelength of 1.3 µm. The PL emission intensity at this point is sufficiently high, and the FWHM of the PL emission peak is as narrow as 20 meV. As can be appreciated from these numerical values, the PL emission is sufficiently sharp.

For comparison, a quantum well structure including an AlGaInNAs barrier layer and a GaInNAs well layer which directly contact each other is produced, and the PL emission characteristics of the comparative quantum well structure are measured. The PL emission intensity is lower than that of the quantum well structure 920 by about two digits, and the FWHM of the PL emission peak is wider than that of the quantum well structure 920.

In the sixth example, the AlGaInNAs lower barrier layer 921 and the GaInNAs well layer 923 grown thereon have exactly the same group V composition and composition ratio as each other. The AlGaInNAs lower barrier layer 921 includes nitrogen. The lower barrier layer 921 and the well layer 923 are different In the group III composition, especially the Al composition ratio. Therefore, by providing the GaInAs intermediate layer 922 which has approximately the same group III composition as that of the well layer 923 and does not include nitrogen, the quantum well structure 920 has satisfactory characteristics.

EXAMPLE 7

Figure 10:
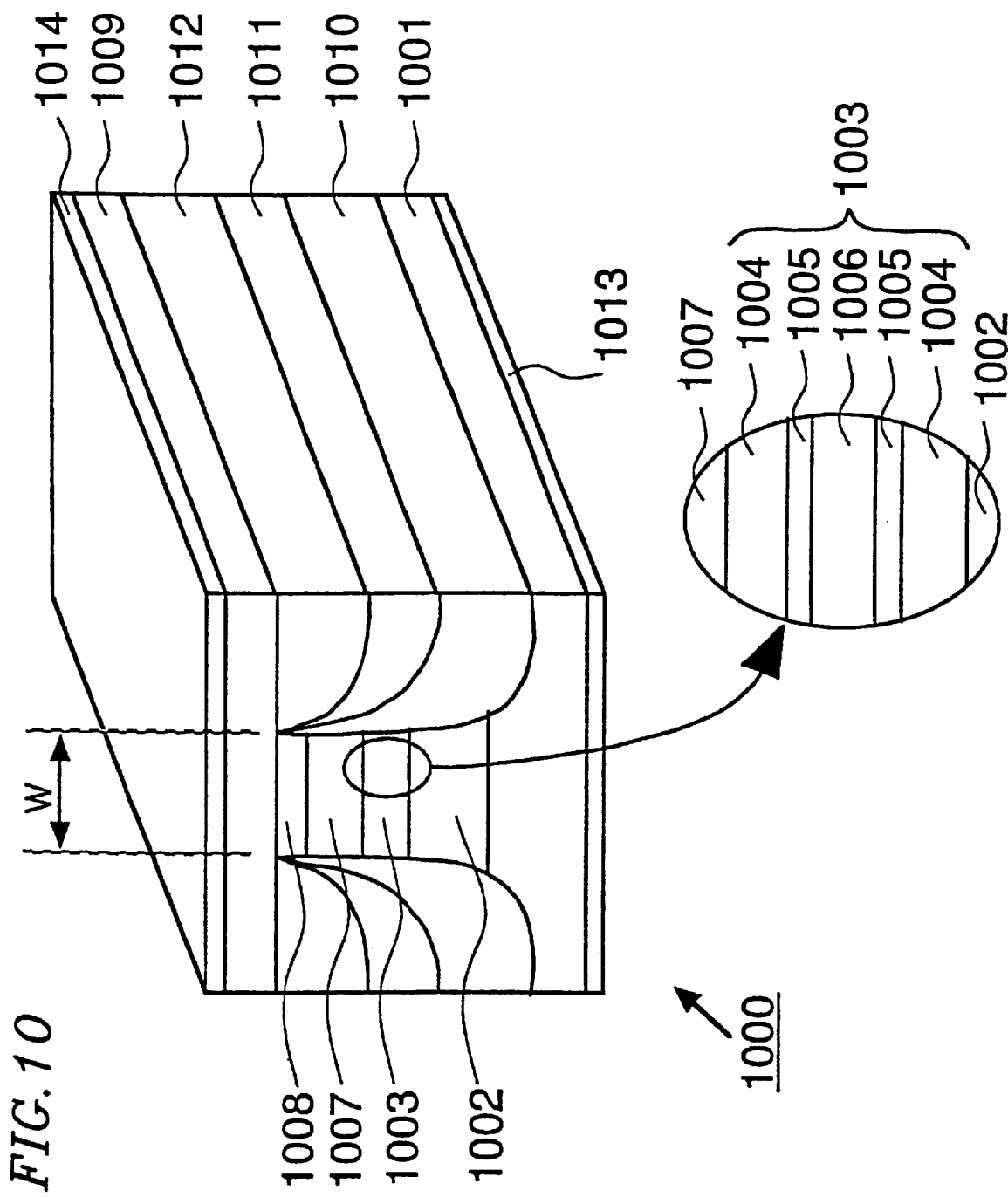
FIG. 10 is a schematic isometric view of a semiconductor laser device according to a seventh example of the present invention.
Figure 11A:
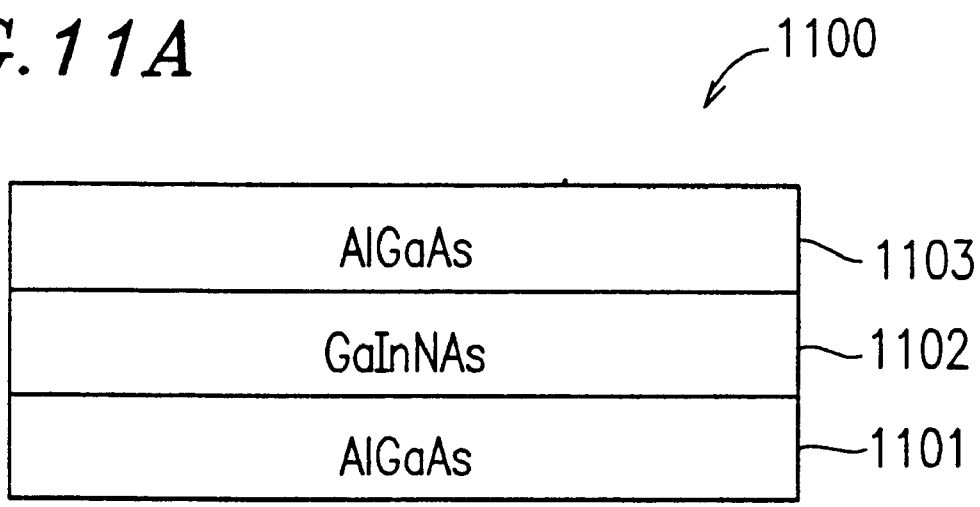
FIG. 11A is a schematic view illustrating a conventional quantum well structure.
Figure 11B:
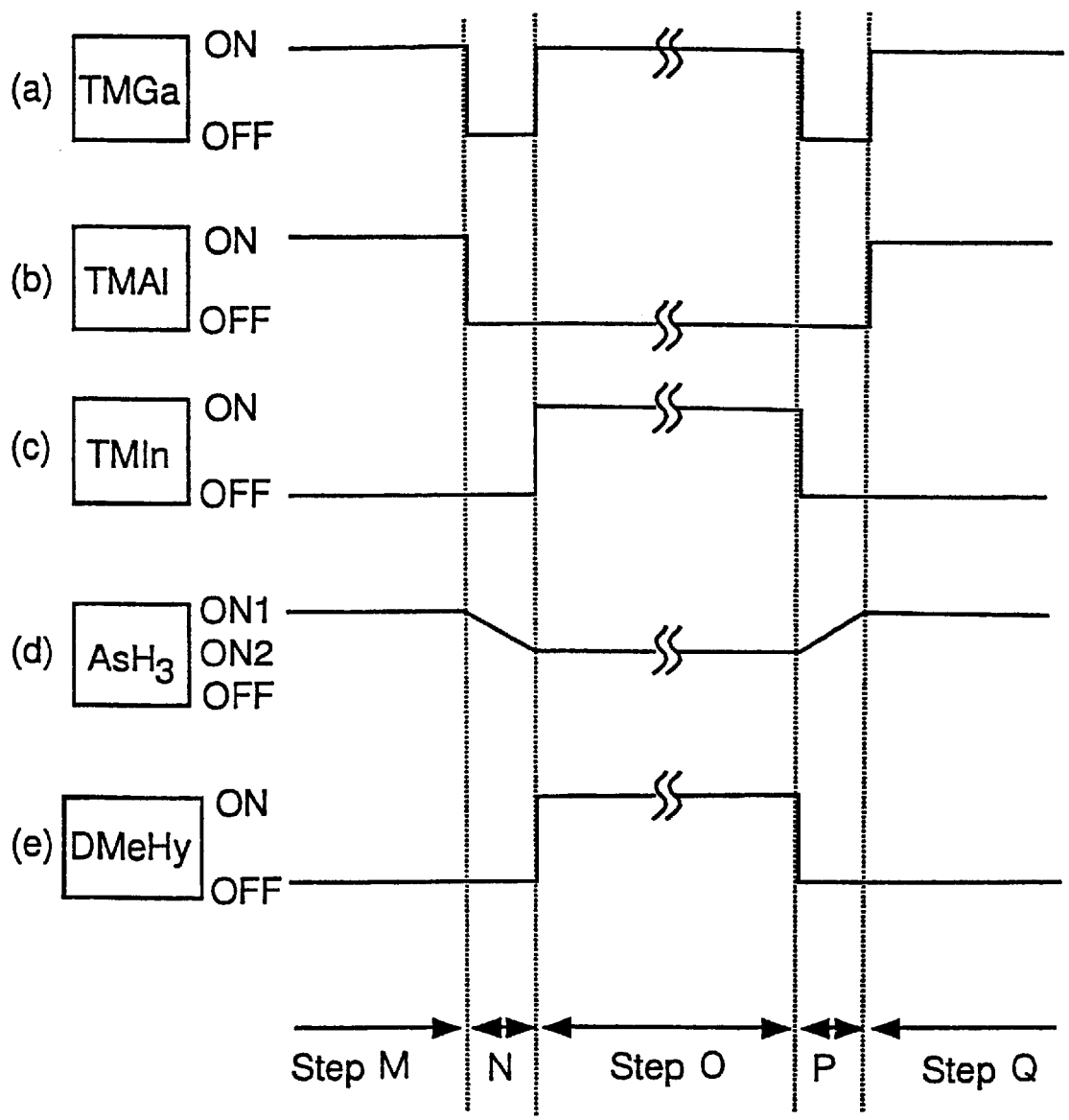
FIG. 11B is a diagram illustrating supply sequences of sources for forming the quantum well structure shown in FIG. 11A.
Figure 12A:
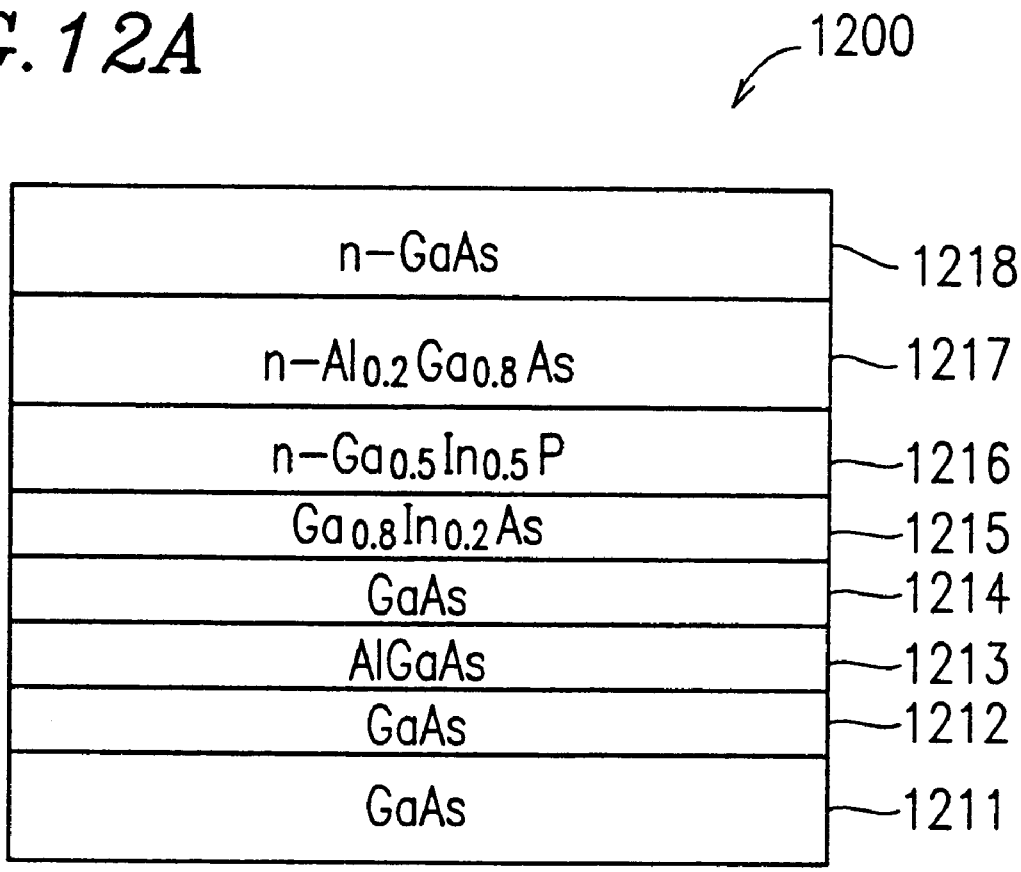
FIG. 12A is a schematic view illustrating another conventional quantum well structure.
Figure 12B:
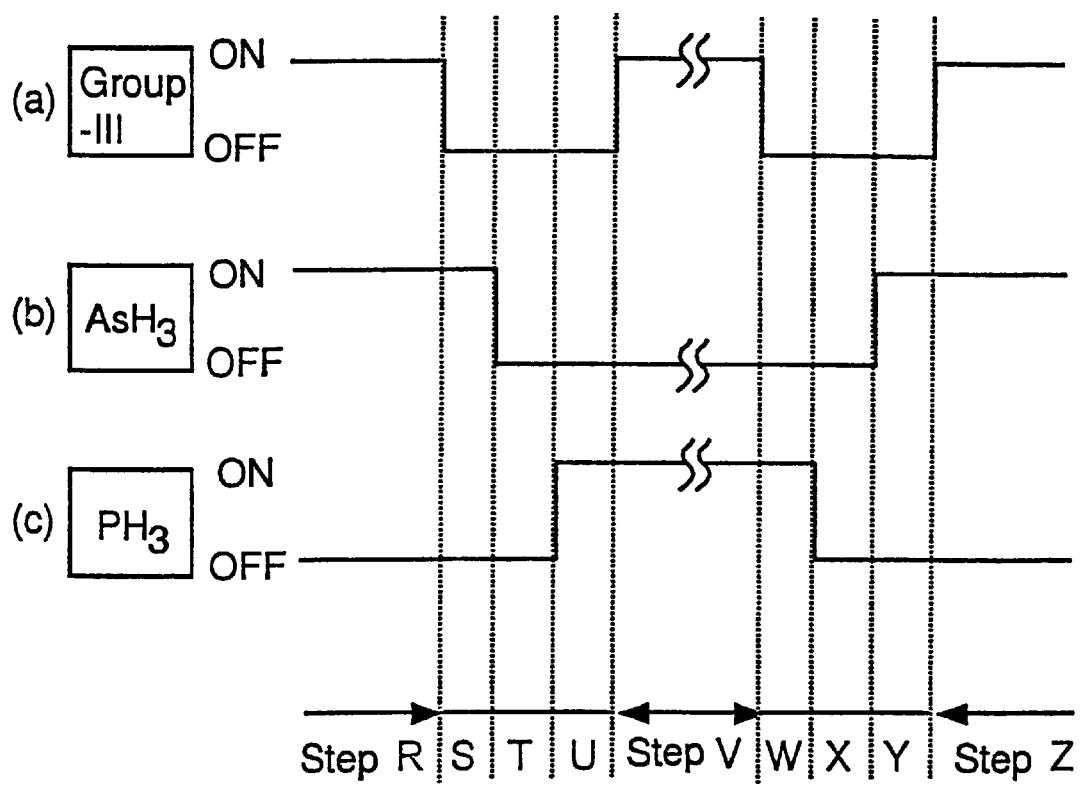
FIG. 12B is a diagram illustrating supply sequences of sources for forming the quantum well structure shown in FIG. 12A.
Figure 13:
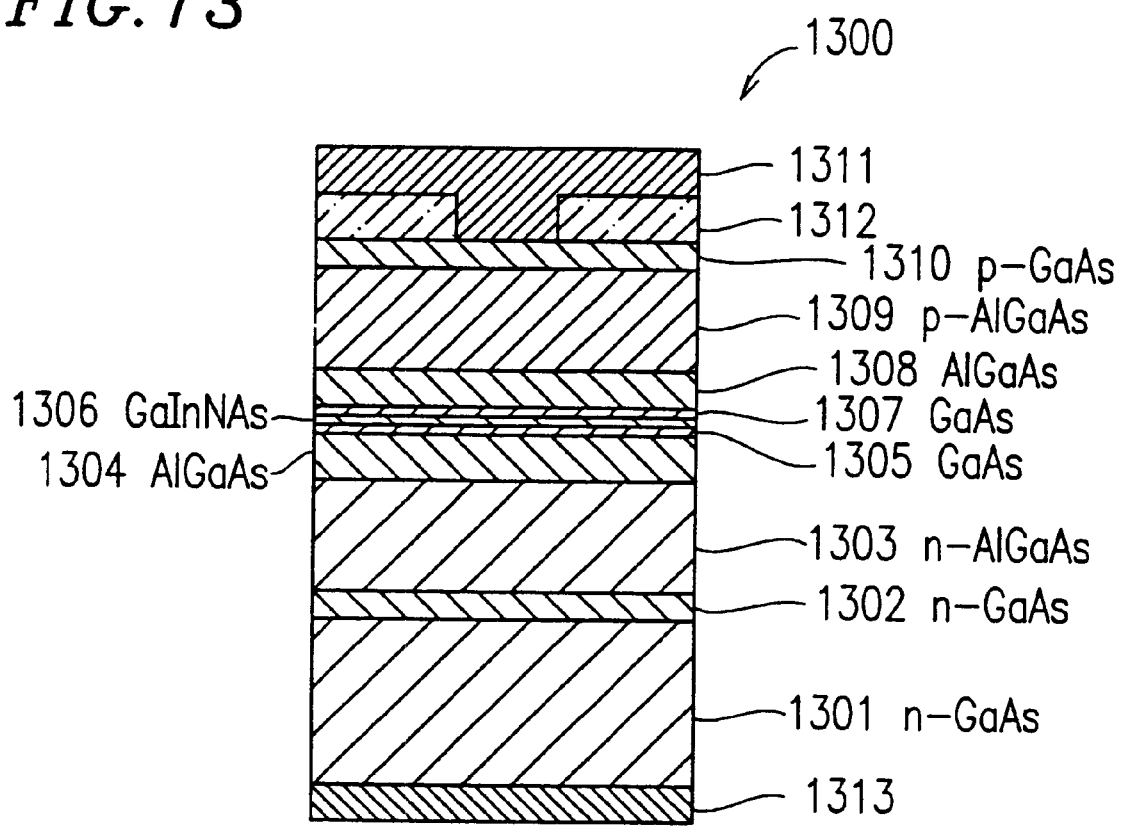
FIG. 13 is a schematic view illustrating a conventional semiconductor light emitting device.

According to a seventh example of the present invention, a semiconductor laser device including a single quantum well structure according to the present invention is provided. FIG. 10 schematically shows a structure of a semiconductor laser device 1000 in the seventh example including a quantum well structure which includes AlGaAs barrier layers and a GaInNAs well layer. The quantum well structure is provided on a GaAs substrate. More specifically, the semiconductor laser device 1000 includes the following elements having the indicated thicknesses.

| | |
|---|---|
| Upper electrode 1014: | AuZn |
| Second contact layer 1009: | $p^+$-GaAs, 0.5 µm |
| First contact layer 1008: | $p^+$-GaAs, 0.5 µm |
| Upper cladding layer 1007: | p-$Al_{0.4}Ga_{0.6}As$, 0.8 µm |
| Guide layer 1004: | $Al_{0.1}Ga_{0.9}As$, 0.15 µm |
| Intermediate layer 1005: | $Ga_{0.7}In_{0.3}As$, 0.6 µm |
| Well layer 1006: | $Ga_{0.7}In_{0.3}N_{0.01}As_{0.99}$, 7 nm |
| Lower cladding layer 1002: | n-$Al_{0.4}Ga_{0.6}As$, 0.8 µm |
| Substrate 1001: | n-GaAs, 100 µm |
| Lower electrode 1013: | AuGe |
| First current stricture layer 1010: | n-$Al_{0.4}Ga_{0.6}As$ |
| Second current stricture layer 1011: | p-$Al_{0.4}Ga_{0.6}As$ |
| Third current stricture layer 1012: | n-$Al_{0.4}Ga_{0.6}As$ |

In FIG. 10, reference numeral 1003 represents a quantum well structure including the layers 1004, 1005 and 1006.

The semiconductor laser device 1000 is produced roughly in the following manner.

First, the n-GaAs substrate 1001 is prepared, and a first cycle of growth is performed on the substrate 1001. Specifically, the lower cladding layer 1002, the guide layers 1004, the intermediate layers 1005, the well layer 1006, the upper cladding layer 1007, and the first contact layer 1008 are formed on the substrate 1001 by gas source MBE using the same types of sources as those in the first example. The supply amounts of the beams of the sources and the growth time periods are appropriately adjusted for each of the layers, so as to provide the prescribed composition ratios and thicknesses. The laminate thus formed in the first cycle of growth is removed from the growth chamber and etched by wet etching so that the laminate has a mesa stripe having a width (W) of 2 µm. As the etching mask, a stripe-shaped silicon nitride film (not shown) shaped by typical photolithography is used.

The stripe-shaped silicon nitride film is left on the laminate even after the wet etching.

Next, a second cycle of growth is performed on the laminate obtained by the wet etching. Specifically, the first current stricture layer 1010, the second current stricture layer 1011, and the third current stricture layer 1012 are grown by MOCVD on the substrate 1001 so as to sandwich the mesa stripe, using the stripe-shaped silicon nitride film as a mask. The laminate formed in the second cycle of growth is removed from the growth chamber, and the silicon nitride film is removed.

Then, a third cycle of growth is performed on the resultant laminate. Specifically, the second contact layer 1009 is grown on the entire top surface of the resultant laminate by MOCVD. The laminate is removed from the growth chamber, and the exposed on the bottom surface of the substrate 1001 is etched until the thickness of the substrate 1001 becomes about 100 μm. The lower electrode 1013 is formed on the bottom surface of the substrate 1001, and the upper electrode 1014 is formed on the top surface of the second contact layer 1009. Then, is the resultant laminate Is cleaved, thereby forming the semiconductor laser device 1000 having a cavity length of 250 μm. The surface exposed by the cleaving is coated with silicon nitride by λ/2 coating (not shown).

The semiconductor laser device 1000 starts laser oscillation of a wavelength of 1.3 μm at a current as low as 8 mA at room temperature. The characteristic temperature ($T_c$) is as satisfactory as 130 K. The result of aging performed at 85° C. and an output of 10 mW shows satisfactory stability that no deterioration is exhibited for 5000 hours or longer. For comparison, a semiconductor laser device having the same structure as that of the semiconductor laser device 1000 except that the intermediate layer 1005 is not provided is subjected to the same measurement. The comparative semiconductor laser device shows inferior characteristics that the laser oscillation starts at a current of 40 mA and that the characteristic temperature is 95 K. The result of aging performed at 85° C. and an output of 10 mW shows rapid deterioration that the operating current rises 20% or more about 200 hours after the start.

The semiconductor laser device 1000 in the seventh example includes the intermediate layer 1005 formed of a GaInAs thin film between the GaInNAs well layer 1006 and the AlGaAs guide layer 1004 also acting as a barrier layer. Due to such a structure, the nitrogen concentration is uniformized in the GaInNAs well layer 1006. In a GaInNAs well layer which emits light having a wavelength of 1.3 μm as in this example has a nitrogen concentration as low as about 1%. Accordingly, the nitrogen composition ratio in the well layer changes even in accordance with a small change in the decomposition efficiency of the nitrogen source in the layer below the well layer or other factors. As a result, the forbidden band width of the well layer is significantly changed. This leads to a reduction in the quantum effect and optical gain. The introduction of the intermediate layer solves these problems and guarantees that the laser oscillation at a low threshold current and stable characteristics of the semiconductor laser device. In addition, the introduction of the intermediate layer prevents the generation of non-light emission centers at the hetero-interface between the well layer and the barrier layers, and thus restricts the deterioration of the semiconductor laser device.

The In composition ratio of the intermediate layer 1005 can be changed in the range of ±50% of the In composition ratio of the well layer 1006 as described in the first example and the like. Therefore, fluctuation in the threshold current density is within about 10%.

The semiconductor laser device 1000 uses the quantum well structure 100 in the first example as a quantum well active layer. The quantum well structures described in the second through sixth examples are also applicable as an active layer of a semiconductor laser device. A semiconductor laser device including one of these quantum well structures can be structured to have appropriate layers such as, for example, a cladding layer, in a usual manner of designing a semiconductor laser device in accordance with the band structure, refractive index and the like of the active layer.

The semiconductor laser device 1000 is an end face-emission Fabry-Perot laser device. The present invention is also applicable to an end face-emission distribution feedback semiconductor laser device (DFB-LD), an end face-emission distribution Bragg reflector semiconductor laser device (DBR-LD), a surface-emission semiconductor laser device, a ring semiconductor laser device, and other well-known semiconductor laser devices. The present invention is also applicable to light emitting diodes and various other light emitting devices; optical modulators, light amplifiers and various other optical waveguide devices; photodetectors and various other light receiving devices; and other photonic devices. The present invention is further applicable to electronic devices actively utilizing a hetero-junction of compound semiconductor materials such as, for example, HBT and HEMT.

In the seventh example according to the present invention, the semiconductor layer including nitrogen and another element other than nitrogen as a group V composition is applied to a quantum well layer of a quantum well active layer. Such a semiconductor layer is also applicable to a bulk active layer. Such a semiconductor layer is further applicable to a light emitting layer, a light amplification layer, a light absorption layer, a light waveguide layer or the like of any appropriate photonic device. The above-mentioned semiconductor layer is also applicable to any appropriate layer of any appropriate electronic device.

A light emitting device including such a semiconductor layer, when applied to optical communication systems, optical measurement systems, optical disk systems or the like, can reduce the power consumption and increase the performance of the systems.

In the first through sixth examples, a quantum well structure produced by a method for growing a compound semiconductor according to the present invention is described. The quantum well structure includes a well layer including nitrogen and a group V element other than nitrogen as a group V composition. The method for growing a compound semiconductor according to the present invention is also applicable to the formation of a hetero-junction usable for any appropriate use. In the above-described examples, the layers including nitrogen and a group V element other than nitrogen is as thin as several nanometers. Even when the layers which are as thick as several micrometers or more are formed, a high quality hetero-junction with the hetero-interface being controlled can be formed.

The growth conditions including the growth technique, the sources, the substrate temperature and the growth rate are not limited to those described in the examples or the combinations described in the examples. Especially, the nitrogen sources described in the examples can be replaced with any appropriate nitrogen source. Although not specifically described in the examples, various alkylamine-based compounds (for example, tertiary butylamine), hydrazine, various alkylhydrazine-based compounds, or other compounds which can be expressed by the following formula are usable.

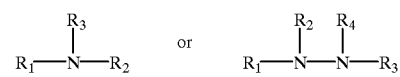

(In the above formula, $R_1$, $R_2$, $R_3$ and $R_4$ are each a hydrogen atom or an arbitrary alkyl group.)

In the above examples, only aluminum and indium are described as elements which are included in the layer to be grown (including nitrogen) and the layer below this layer and have a strong influence on the reactivity of the layers with nitrogen. Other group III and group V elements and impurity elements which have similar influences are also applicable.

In the above examples, a GaAs substrate is used. Other usable substrates include GaP, GaAsP, InGaAs and various other group III–V compound semiconductor substrates; ZnSe, ZnS and various other group II–VI compound semiconductor substrates; and Ge, Si, SiC and various other group IV semiconductor substrates. The composition and composition ratios of the layer to be grown, the band gap wavelength, and the combination of the materials forming hetero-junction are not limited to those described in the examples and can be appropriately modified.

The compound semiconductors described in the examples appropriately include Ga, In and Al as group III elements, and As, P, Sb and N as group V elements. A similar effect is provided when various other group III elements (for example, B and Tl), various other group V elements (for example, Bi), and impurity elements (for is example, Zn, Be, Mg, Te, S, Se, Si, and Ge) are included.

According to the present invention, when a group III–V compound semiconductor layer including nitrogen and at least one element other than nitrogen as a group V composition is grown on a group III–V compound semiconductor layer, the uniformity of the nitrogen concentration at and in the vicinity of the interface between the layers is improved. Therefore, the generation of non-light emission centers at the interface is reduced. This effect is more noticeable in the case where either one of the two layers includes at least one of Al or In as a group III composition.

As described above, a quantum well structure including a well layer which includes nitrogen and at least one group V element other than nitrogen as a group V composition has significantly improved quantum efficiency and light emission efficiency.

A light emitting device including such a quantum well structure as an active layer starts laser oscillation at a sufficiently low threshold current.

Various other modifications will be apparent to and can be readily made by those skilled in the art without departing from the scope and spirit of this invention. Accordingly, It is not intended that the scope of the claims appended hereto be limited to the description as set forth herein, but rather that the claims be broadly construed.

What is claimed is:

1. A method for growing a compound semiconductor, comprising:
   a first formation step of forming a first group III–V compound layer on a substrate;
   a second formation step of forming a second group III–V compound layer including nitrogen and at least one group V element other than nitrogen as a group V composition on the substrate over the first group III–V compound layer;
   a third formation step of forming a third group III–V compound layer directly between and contacting each of the first group III–V compound layer and the second group III–V compound layer; and
   wherein the second group III–V compound layer and the third group III–V compound layer each include indium as a group III composition, and an indium composition ratio of the third group III–V compound layer is in a range of −50% to +50% of an indium composition ratio of the second group III–V compound layer.

2. A method for growing a compound semiconductor according to claim 1, wherein the first formation step, the third formation step and the second formation step are performed sequentially in this order.

3. A method for growing a compound semiconductor according to claim 2, wherein the second formation step is performed continuously after the third formation step.

4. A method for growing a compound semiconductor according to claim 1, wherein the second formation step, the third formation step and the first formation step are performed sequentially in this order.

5. A method for growing a compound semiconductor according to claim 4, wherein the third formation step is performed continuously after the second formation step.

6. A method for growing a compound semiconductor according to claim 1, wherein the first formation step, the third formation step and the second formation step are performed sequentially in this order, and then the third formation step and the first formation step are performed sequentially in this order.

7. A method for growing a compound semiconductor according to claim 6, wherein the first formation step, the third formation step, the second formation step, the third formation step and the first formation step are continuously performed.

8. A method for growing a compound semiconductor according to claim 1, wherein a composition of the third group III–V compound layer is determined so that a reactivity of the third group III–V compound layer with the nitrogen source and a reactivity of the second group III–V compound layer with the nitrogen source are substantially equal to each other.

9. A method for growing a compound semiconductor according to claim 1, wherein the first group III–V compound layer includes at least one of aluminum and indium as a group III composition.

10. A method for growing a compound semiconductor according to claim 1, wherein the third group III–V compound layer includes at least one group V element other than nitrogen as a group V composition, and the third group III–V compound layer has a group III composition which is substantially equal to a group III composition of the second group III–V compound layer.

11. A method for growing a compound semiconductor according to claim 10, wherein the third group III–V compound layer has a group III composition ratio which is substantially equal to a group III composition ratio of the second group III–V compound layer.

12. A method for growing a compound semiconductor according to claim 1, wherein the third group III–V compound layer has a thickness which corresponds to one molecule at a minimum and a critical thickness at a maximum.

13. A method for growing a compound semiconductor according to claim 1, wherein the nitrogen source used in the second formation step is a compound expressed by the formula:

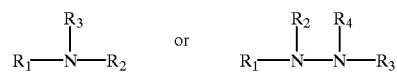

where $R_1$, $R_2$, $R_3$ and $R_4$ are each a hydrogen atom or an arbitrary alkyl group.

14. A method for growing a compound semiconductor, comprising:
   a first formation step of forming a first group III–V compound layer on a substrate;
   a second formation step of forming a second group III–V compound layer including nitrogen and at least one group V element other than nitrogen as a group V composition on the substrate over the first group III–V compound layer;

a third formation step of forming a third group III–V compound layer directly between and contacting each of the first group III–V compound layer and the second group III–V compound layer; and wherein the second group III–V compound layer and the third group III–V compound layer each include aluminum as a group III composition, and an aluminum composition ratio of the third group III–V compound layer is in a range of −30% to +30% of an aluminum composition ratio of the second group III–V compound layer.

15. A method for growing a compound semiconductor, comprising:

forming a barrier layer including a first group III–V compound layer;

forming a well layer including a second group III–V compound layer including nitrogen and at least one group V element other than nitrogen as a group V composition;

forming an intermediate layer including a third group III–V compound layer between the barrier layer and the well layer, wherein the third group III–V compound layer includes at least one element other than nitrogen as a group V composition, and the third group III–V compound layer has a group III composition which is substantially equal to a group III composition of the second group III–V compound layer, and wherein the second group III–V compound layer and the third group III–V compound layer each include indium as a group III composition, and an indium composition ratio of the third group III–V compound layer is in the range of −50% to +50% of the indium composition ratio of the second group III–V compound layer.

16. A method for growing a compound semiconductor, comprising:

forming a barrier layer including a first group III–V compound layer;

forming a well layer including a second group III–V compound layer including nitrogen and at least one group V element other than nitrogen as a group V composition;

forming an intermediate layer including a third group III–V compound layer between the barrier layer and the well layer, wherein the third group III–V compound layer includes at least one element other than nitrogen as a group V composition, and the third group III–V compound layer has a group III composition which is substantially equal to a group III composition of the second group III–V compound layer, and wherein the second group III–V compound layer and the third group III–V compound layer each include aluminum as a group III composition, and an aluminum composition ratio of the third group III–V compound layer is in the range of −30% to +30% of the aluminum composition ratio of the second group III–V compound layer.

17. A method for growing a compound semiconductor according to claim 16, wherein the second group III–V compound layer acts as a light emitting layer.

18. A method for growing a compound semiconductor, comprising:

forming a first group III–V compound layer;

forming a second group III–V compound layer including nitrogen and at least one group V element other than nitrogen as a group V composition;

forming a third group III–V compound layer provided between the first group III–V compound layer and the second group III–V compound layer, wherein the third group III–V compound layer includes at least one element other than nitrogen as a group V composition, and the third group III–V compound layer has a group III composition which is substantially equal to a group III composition of the second group III–V compound layer, and wherein the second group III–V compound layer and the third group III–V compound layer each include indium as a group III composition, and an indium composition ratio of the third group III–V compound layer is in the range of −50% to +50% of the indium composition ratio of the second group III–V compound layer.

19. A method for growing a compound semiconductor, comprising:

forming a first group III–V compound layer;

forming a second group III–V compound layer including nitrogen and at least one group V element other than nitrogen as a group V composition;

forming a third group III–V compound layer provided between the first group III–V compound layer and the second group III–V compound layer, wherein the third group III–V compound layer includes at least one element other than nitrogen as a group V composition, and the third group III–V compound layer has a group III composition which is substantially equal to a group III composition of the second group III–V compound layer, and wherein the second group III–V compound layer and the third group III–V compound layer each include aluminum as a group III composition, and an aluminum composition ratio of the third group III–V compound layer is in the range of −30% to +30% of the aluminum composition ratio of the second group III–V compound layer.

20. A method for growing a compound semiconductor, comprising:

forming a barrier layer including a first group III–V compound layer;

forming a well layer including a second group III–V compound layer including nitrogen and at least one group V element other than nitrogen as a group V composition; and forming an intermediate layer including a third group III–V compound layer directly between and contacting each of the barrier layer and the well layer, wherein the third group III–V compound layer includes at least one element other than nitrogen as a group V composition, and the third group III–V compound layer has a group III composition which is substantially equal to a group III composition of the second group III–V compound layer, and wherein at least one of the second and third group III–V compound layers includes Al.

21. The method of claim 1, further comprising the third group III–V compound layer being formed for controlling a reactivity of the second group III–V compound layer with a nitrogen source used in the second formation step.

22. The method of claim 14, further comprising the third group III–V compound layer being formed for controlling a reactivity of the second group III–V compound layer with a nitrogen source used in the second formation step.

* * * * *